United States Patent
Sumi et al.

(10) Patent No.: US 6,894,571 B2
(45) Date of Patent: May 17, 2005

(54) PHASE LOCKED LOOP CIRCUIT WITH SELECTABLE VARIABLE FREQUENCY DIVIDERS

(75) Inventors: Yasuaki Sumi, Tottori (JP); Norio Morimoto, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 72 days.

(21) Appl. No.: 10/250,671

(22) PCT Filed: Jan. 15, 2002

(86) PCT No.: PCT/JP02/00211
§ 371 (c)(1),
(2), (4) Date: Jul. 15, 2003

(87) PCT Pub. No.: WO02/056476
PCT Pub. Date: Jul. 18, 2002

(65) Prior Publication Data
US 2004/0046612 A1 Mar. 11, 2004

(30) Foreign Application Priority Data

| Jan. 15, 2001 | (JP) | 2001-006722 |
| Jan. 16, 2001 | (JP) | 2001-008063 |
| Jan. 19, 2001 | (JP) | 2001-011944 |
| Jan. 24, 2001 | (JP) | 2001-015789 |
| Jan. 25, 2001 | (JP) | 2001-017186 |

(51) Int. Cl.[7] .............................................. H03L 7/00
(52) U.S. Cl. ............................. 331/25; 331/1 A; 331/17
(58) Field of Search ............................ 331/25, 17, 1 A, 331/10, 11, 16; 327/156, 159

(56) References Cited

U.S. PATENT DOCUMENTS

| 4,868,514 A | * | 9/1989 | Azevedo et al. ............. 327/159 |
| 4,987,387 A | * | 1/1991 | Kennedy et al. ............. 331/1 A |
| 6,148,052 A | * | 11/2000 | Bogdan ....................... 375/375 |

FOREIGN PATENT DOCUMENTS

| JP | 9-8655 | 1/1997 |
| JP | 10-135822 | 5/1998 |
| JP | 2001-267918 | 9/2001 |

* cited by examiner

Primary Examiner—Robert Pascal
Assistant Examiner—Joseph Chang
(74) Attorney, Agent, or Firm—Arent Fox PLLC

(57) ABSTRACT

A PLL circuit comprises a reference signal generating unit for generating reference signals of different phases, variable frequency dividers for dividing the frequency of the output signal of a voltage-controlled oscillator (VCO) and thereby outputting feedback signals, and a phase comparator for comparing the phase of each feedback signal with that of the corresponding reference signal and thereby outputting phase comparison signals. When the output signal is synchronized with a preset frequency signal, at least one variable frequency divider of the variable frequency dividers is operated, and the operation of the other is stopped.

17 Claims, 8 Drawing Sheets

PHASE LOCKED LOOP CIRCUIT WITH SELECTABLE VARIABLE FREQUENCY DIVIDERS

CROSS-REFERENCE TO RELATED APPLICATION

This application is a National Stage entry of International Application No. PCT/JP02/00211, filed Jan. 15, 2002.

TECHNICAL FIELD

The present invention relates to a PLL circuit.

BACKGROUND ART

A conventional example of this kind of circuit is shown in "SANYO TECHNICAL REVIEW," Vol. 10, No. 1, February, 1978, page 32. However, this circuit is of the single-phase-comparator type (that is, it uses only one stage of a phase comparator). Thus, this circuit performs phase comparison only once during one period of the reference signal, resulting in a first disadvantage of having a short lock-up time (i.e., the time required to synchronize with the output signal).

A proposal to overcome this disadvantage is made in the Japanese Patent Application Laid-Open No. H10-135822. According to this publication, there are provided a reference signal generator that produces a plurality of reference signals having different phases from each other, a plurality of (for example, four) frequency dividers that divide the output signal of a voltage-controlled oscillator, and a plurality of phase comparators that compare the feedback signals from the individual frequency dividers with the corresponding reference signals.

The circuit according to the above publication, however, has a second advantage of consuming too much electric power. This second disadvantage has been found to stem from the provision of a plurality of frequency dividers. If further reduction of the lock-up time is attempted by performing phase comparison 16 times during one period of the reference signal, it is necessary to use 16 frequency dividers, leading to higher electric power consumption.

Moreover, the use of a plurality of frequency dividers, which each occupy a considerably large space, makes the device as a whole large, expensive, and difficult to fabricate in the form of an LSI. This is a third disadvantage.

A proposal to overcome these disadvantages is made in Japanese Patent Application Laid-Open No. 2001-267918. According to this publication, a first and a second variable frequency divider output a first and a second feedback signal, respectively. However, while these feedback signals are being output simultaneously, the outputs of phase comparators to which those feedback signals are fed interfere with each other, causing unlocking (the phenomenon in which the output signal that is coming into phase suddenly deviates from the preset frequency). This is a fourth disadvantage.

Moreover, the second variable frequency divider performs frequency division by a division factor equal to the integer part of N/n (where N and n are integers). (This is because a variable frequency divider that performs frequency division by a division factor containing a fraction has the disadvantages of being expensive and operating unstably.) Performing frequency division by a division factor equal to the integer part as described above, the second variable frequency divider produces an error from the ideal feedback signal that would be obtained if frequency division was performed by a division factor of exactly N/n. Accordingly, a phase comparator PC2 connected to the second variable frequency divider outputs a phase comparison signal that contains that error (in the present specification, such a signal is called an error signal). As a result, the output signal has a frequency deviated from the preset frequency. This is a fifth disadvantage.

Furthermore, by the use of the first and second variable frequency dividers, phase comparison is performed a plurality of times. This requires that an up counter, a decoder, an OR circuit, an AND circuit, and other circuits be provided between the output side of the second variable frequency divider and the phase comparator PC2, resulting in a complicated circuit configuration. This is a sixth disadvantage.

DISCLOSURE OF THE INVENTION

The present invention has been devised to overcome these conventionally encountered disadvantages, and it is an object of the present invention to provide a PLL circuit that has a short lock-up time, that consumes less electric power, that is inexpensive, and that is easy to fabricate in the form of an LSI.

To achieve the above object, according to one aspect of the present invention, a PLL circuit is provided with: a reference signal generator that generates a plurality of reference signals having different phases; a plurality of variable frequency dividers that individually divide the output signal of a voltage-controlled oscillator to output feedback signals and that are set to perform frequency division by different division factors; a phase comparator that performs phase comparison between the feedback signals and the reference signals to output a plurality of phase comparison signals; a lock detector that detects whether or not the feedback signal from a first variable frequency divider among the variable frequency dividers which is set to perform frequency division by the greatest division factor is close to the preset frequency; and a controller that operates all the variable frequency dividers at the start-up of the PLL circuit and that thereafter, when the lock detector detects the feedback signal being close to the preset frequency, stops the variable frequency dividers other than the first variable frequency divider.

According to another aspect of the present invention, a PLL circuit is provided with: a reference signal generator that generates first and second reference signals; first and second variable frequency dividers that individually divide the output signal of a voltage-controlled oscillator to output first and second feedback signals respectively; a signal eliminator that converts the first feedback signal into a third feedback signal by eliminating the output of the second feedback signal while the first feedback signal is being output; a lock detector that detects whether or not the first feedback signal from the first variable frequency divider is close to the preset frequency; and a controller that operates both the first and second variable frequency dividers at the start-up of the PLL circuit and that thereafter, when the lock detector detects the first feedback signal being close to the preset frequency, stops the second variable frequency divider.

According to another aspect of the present invention, a PLL circuit is provided with: a reference signal generator that produces a plurality of reference signals; a plurality of variable frequency dividers that individually divide the output signal of a voltage-controlled oscillator to output a plurality of feedback signals corresponding to the plurality of reference signals; and a phase comparator that performs phase comparison between the feedback signals and the reference signals respectively. Here, when the output signal of the voltage-controlled oscillator is exactly or almost in synchronism with the preset signal, error signals produced by the phase comparator are not passed to the voltage-controlled oscillator.

According to another aspect of the present invention, a PLL circuit is provided with: a reference signal generator that produces a plurality of reference signals; a plurality of variable frequency dividers that individually divide the output signal of a voltage-controlled oscillator to output a plurality of feedback signals corresponding to the plurality of reference signals; and a phase comparator that performs phase comparison between the feedback signals and the reference signals respectively. Here, in predetermined periods, error signals produced by the phase comparator are not passed to the voltage-controlled oscillator.

According to another aspect of the Present invention, a PLL circuit is provided with: a reference signal generator that produces a plurality of reference signals; a plurality of variable frequency dividers that individually divide the output signal of a voltage-controlled oscillator to produce feedback signals, the variable frequency dividers including at least a first variable frequency divider that is set to perform frequency division by a division factor of N (where N is an integer) equal to the value obtained by dividing a preset frequency by a reference frequency of the reference signals and a second variable frequency divider that is set to perform frequency division by a division factor of N/n (where n is an integer fulfilling N>n); a phase comparator that performs phase comparison between the feedback signals and the reference signals respectively; and a rounding circuit that feeds the second variable frequency divider with a division factor corrected for the error ascribable to the remainder part of N/n by scattering the division factor N/n containing the remainder part among a combination of a plurality of different integral division factors.

BEST MODE FOR CARRYING OUT THE INVENTION

<First Embodiment>

Figure 1:
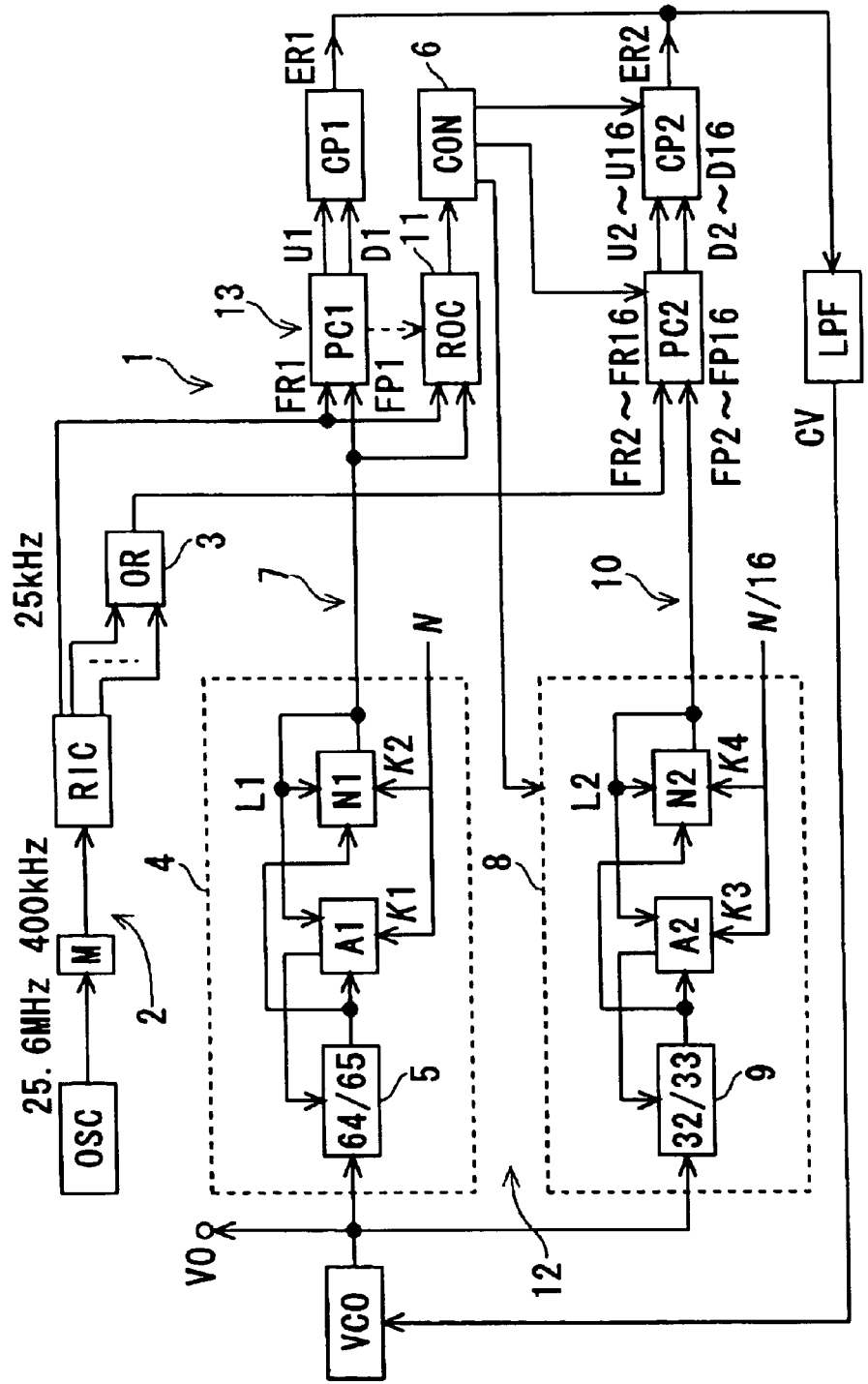
FIG. 1 is a block diagram of a PLL circuit embodying the invention.

Hereinafter, with reference to FIGS. 1 and 2, the PLL circuit 1 of a first embodiment of the invention will be described. FIG. 1 is a block diagram of the PLL circuit 1, and FIG. 2 is a time chart of the relevant signals used in the PLL circuit 1.

In these figures, a reference signal generator 2 is composed of, for example, a reference oscillator OSC, a fixed frequency divider M, a ring counter RIC, an OR gate 3, and other components. The fixed frequency divider M performs frequency division by a division factor of, for example, 64, and is connected between the reference oscillator OSC and the ring counter RIC. The fixed frequency divider M divides by a division factor of 64 the signal output from the reference oscillator OSC (oscillating at a frequency of, for example, 25.6 Mhz), and feeds the resulting signal (having a frequency of 400 kHz) to the ring counter RIC.

The ring counter RIC is composed of, for example, 16 flip-flops (not shown) connected together, and outputs 16 reference signals FR1 to FR16 that it produces from the 400 kHz signal fed thereto.

Figure 2:
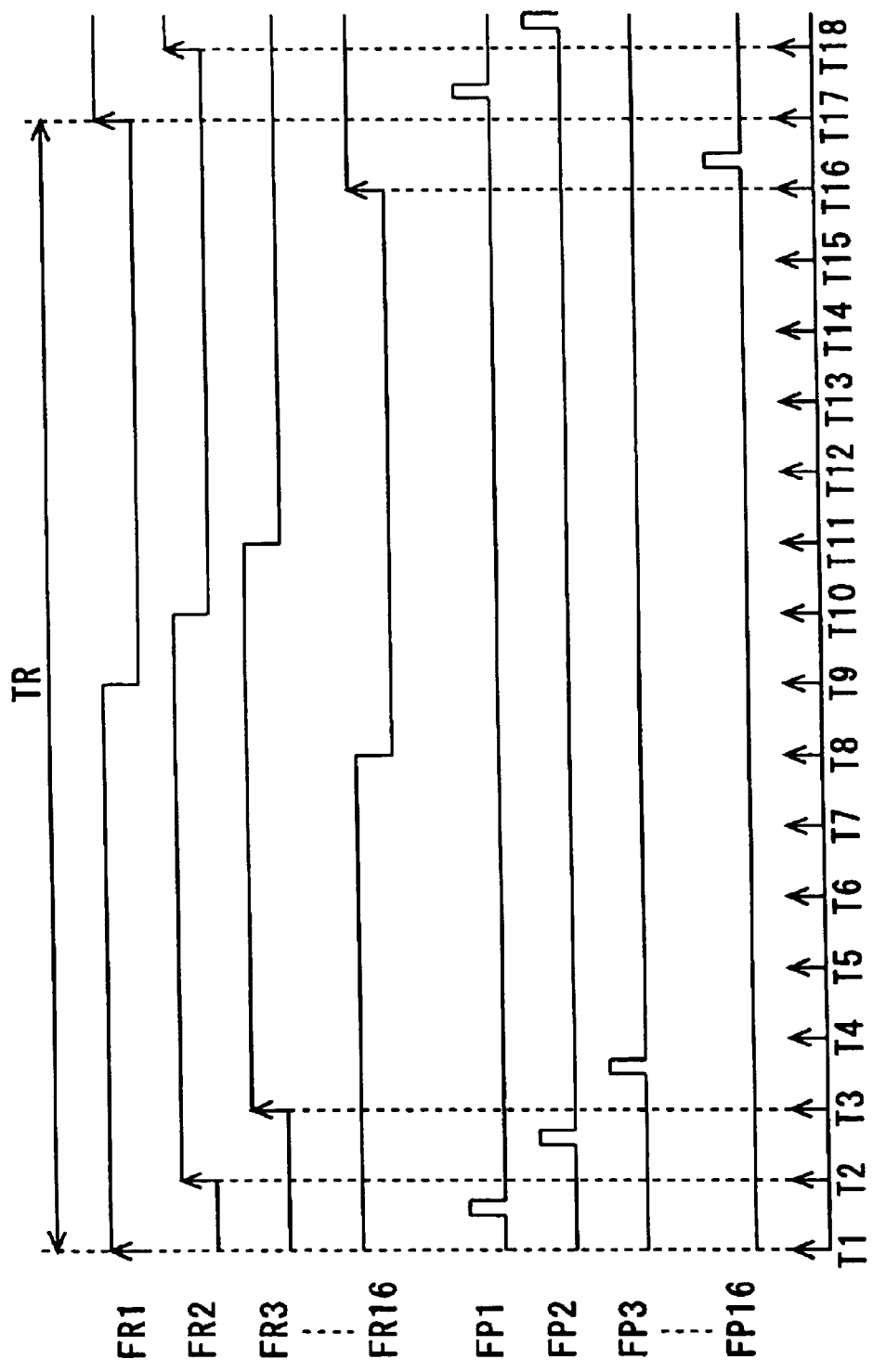
FIG. 2 is a time chart of the relevant signals used in the PLL circuit shown in FIG. 1.

As shown in FIG. 2, the reference signal FR2 is delayed from the reference signal FR1 by $1/16$ of the period of the reference signal FR1. Likewise, the reference signal FRA (where A is an integer in the range from 2 to 16) is delayed from the reference signal FR1 by $(A-1)/16$ of the period of the reference signal FR1. Thus, the reference signals FR1 to FR16 all have a reference frequency of 400 kHz/16=25 kHz, which is equal to the desired channel space (the frequency difference between two adjacent channels). As described above, the reference signal generator 2 produces a plurality of reference signals FR1 to FR16 having different phases.

The reference signal FR1 is fed to one input terminal of a first phase comparator PC1. The reference signals FR2 to FR16 are fed individually to the input terminals of the OR gate 3, and the output of the OR gate 3 is fed to one input terminal of a second phase comparator PC2. That is, while one reference signal FR1 is fed to the first phase comparator PC1, a plurality of reference signals FR2 to FR16 are subjected to an OR operation by the OR gate 3, and their OR is fed to the second phase comparator PC2.

A first variable frequency divider 4 is composed of, for example, a dual modulus prescaler 5, a swallow counter A1, a course counter N1, and other components. The dual modulus prescaler 5 performs frequency division by a division factor of, for example, either 64 or 65. The swallow counter A1 is connected to a first coincidence circuit (not shown), and the course counter N1 is connected to a second coincidence circuit (not shown). The first variable frequency divider 4 outputs a load signal L1, which is fed to the swallow counter A1 and to the course counter N1.

For example, suppose that the user has set the preset frequency at 1.65 GHz by operating frequency setting keys (not shown). Then, a controller 6 (composed of a microcomputer and other components) connected to the frequency setting keys calculates the target division factor N by which the first variable frequency divider 4 should perform frequency division, and feeds the calculated division factor N to the first variable frequency divider 4. Specifically, here, N=1.65×10$^6$ kHz/25 kHz=66,000 (since the reference frequency is 25 kHz). That is, the first variable frequency divider 4 is set to perform frequency division by a division factor equal to N, which is the value obtained by dividing the preset frequency by the reference frequency.

Based on the above division factor N, the controller 6 then calculates the number of times K1 that the swallow counter A1 should operate and the number of times K2 that the course counter N1 should operate, and sets the calculated numbers K1 and K2 in those counters, respectively (for example, K1=16 and K2=1,031). In this way, the first variable frequency divider 4 is configured as a pulse swallow counter, and its division factor is switched according to only two variables. This helps reduce transmission delay and thereby achieve a higher operation rate.

In this way, a feedback signal FP1 obtained by dividing the output signal VO of a voltage-controlled oscillator VCO by a division factor of N is fed to the other input terminal of the first phase comparator PC1.

The first phase comparator PC1 performs phase comparison between the reference signal FR1 and the feedback signal FP1, and feeds phase comparison signals (a pump-up signal U1 and a pump-down signal D1) to a first charge pump CP1. That is, the first phase comparator PC1 performs phase comparison between one reference signal FR1 and one feedback signal FP1 output from the first variable frequency divider 4.

Based on those phase comparison signals U1 and D1, the first charge pump CP1 produces a first output voltage ER1, and feeds it to a low-pass filter LPF.

The low-pass filter LPF, by eliminating high-frequency components contained in the first output voltage ER1, produces a control voltage CV, and feeds it to the voltage-controlled oscillator VCO. Thus, the reference signal generator 2, first phase comparator PC1, first charge pump CP1, low-pass filter LPF, voltage-controlled oscillator VCO, first variable frequency divider 4, and other components together constitute a first PLL frequency synthesizer 7.

A second variable frequency divider 8 is composed of, for example, a dual modulus prescaler 9, a swallow counter A2, a course counter N2, and other components. The dual modulus prescaler 9 performs frequency division by a division factor of, for example, either 32 or 33. The swallow counter A2 is connected to a first coincidence circuit (not shown), and the course counter N2 is connected to a second coincidence circuit (not shown). The second variable frequency divider 8 outputs a load signal L2, which is fed to the swallow counter A2 and to the course counter N2.

As described above, the first variable frequency divider 4 is fed with a division factor N. Let n be an integer equal to or greater than 2, and preferably equal to the total number of reference signals FR1 to FR16. Then, the second variable frequency divider 8 is set to perform frequency division by a division factor of, for example, N/n.

For example, suppose that n=16. Then, the controller 6 feeds the second variable frequency divider 8 with a division factor N/n=66,000/16=4,125. Based on this division factor N/n, the controller 6 then calculates the number of times K3 that the swallow counter A1 should operate and the number of times K4 that the course counter N2 should operate, and sets the calculated numbers K3 and K4 in those counters, respectively (for example, K3=29 and K4=128).

In this way, the second variable frequency divider 8 divides the output signal VO of the voltage-controlled oscillator VCO by a division factor of N/n (for example, 4,125), and outputs 16 feedback signals fp1 and FP2 to FP16 (in FIG. 2, the feedback signal fp1 is not shown).

To one input terminal of the second phase comparator PC2 are fed, one after the next, the reference signals FR2 to FR16 produced by the reference signal generator 2 and the OR gate 3. To the other input terminal of the second phase comparator PC2 are fed, one after the next, the feedback signals fp1 and FP2 to FP16 produced by the second variable frequency divider 8. That is, the second phase comparator PC2 receives the reference signals FR2 to FR16 after they are subjected to an OR operation, i.e., in the form of their OR. Moreover, the second phase comparator PC2 directly receives the feedback signals fp1 and FP2 to FP16 output from the second variable frequency divider 8 (i.e., not through extra components such as an up counter, a decoder, an OR circuit, an AND circuit, and other circuits as is usual in a conventional configuration). charge pump CP2 produces a second output voltage ER2, and feeds it to the low-pass filter LPF.

The low-pass filter LPF, by eliminating high-frequency components contained in the second output voltage ER2, produces a control voltage CV, and feeds it to the voltage-controlled oscillator VCO. Thus, the reference signal generator 2, OR gate 3, second phase comparator PC2, second charge pump CP2, low-pass filter LPF, voltage-controlled oscillator VCO, second variable frequency divider 8, and other components together constitute a second PLL frequency synthesizer 10.

A lock detector 11 receives the feedback signal FP1 output from the first variable frequency divider 4, and also receives the reference signal FR1. The lock detector 11 has a well-known configuration composed of, for example, an AND gate, a resistor, and other components. When the PLL circuit 1 starts up (in a searching state), the frequency of the output signal VO of the voltage-controlled oscillator VCO differs from the preset frequency, and therefore the feedback signal FP1 and the reference signal FR1 are out of synchronism with each other. In this state, the lock detector 11 feeds the controller 6 with a low signal (an out-of-synch detect signal).

When the PLL circuit 1 is locked (for example, when the frequency of the output signal VO has come within ±300 Hz of the preset frequency), the feedback signal FP1 and the reference signal FR1 are almost in synchronism with each other. In this state, the lock detector 11 feeds the controller 6 with a high signal (a synch detect signal). This state is referred to as the "steady state."

The output terminals of the controller 6 are electrically connected to the second variable frequency divider 8, to the second phase comparator PC2, and to the second charge pump CP2, respectively. The lock detector 11 may be annexed to or integrated into the first phase comparator PC1. The components thus far described together constitute the PLL circuit 1.

The following is a summary of the features of this PLL circuit 1. In the PLL circuit 1, there is provided a reference signal generator 2 that produces a plurality of reference signals FR1 to FR16 having different phases. A plurality of variable frequency dividers 12 divide the output signal VO of a voltage-controlled oscillator VCO, and output a plurality of feedback signals FP1 to FP16.

A phase comparator 13 performs phase comparison between the feedback signals FP1 to FP16 and the reference signals FR1 to FR16, respectively, and outputs a plurality of phase comparison signals (U1 to U16 and D1 to D16).

A first variable frequency divider 4 is fed with a division factor N (where N is the value obtained by dividing the preset frequency of the output signal VO by a reference frequency). The feedback signal FP1 output from the first variable frequency divider 4 and the reference signal FR1 are fed to a lock detector 11. The lock detector 11 detects whether the output signal VO is in synchronism with the preset frequency or not.

The variable frequency dividers 12 include the first variable frequency divider 4 and a second variable frequency divider 8. The second variable frequency divider 8 is fed with a division factor N/n (where n is an integer equal to or greater than 2, and preferably equal to the total number of reference signals FR1 to FR16, namely 16).

In the example being described, N/n=4,125. This value is an integer, and is therefore used intact as the division factor. Now, suppose that the preset frequency of the output signal VO is, for example, 755 MHz. Then, $N=755 \times 10^3$ kHz/25 kHz=30,200 and N/n=30,200/16=1,887.5. When N/n contains a fraction (i.e., when it is not an integer) as in this case, an integer, namely 1,887 or 1,888, that is close to the value of N/n, namely 1,887.5, is used as the division factor.

Next, with reference to FIGS. 1 and 2, the operation of the PLL circuit 1 will be described. First, suppose, for example, that the user sets the preset frequency at 1.65 GHz with the frequency setting keys and then presses a start key.

The controller 6 feeds the first variable frequency divider 4 with a division factor N=66,000. Simultaneously, the controller 6 feeds the second variable frequency divider 8 with a division factor N/n=66,000/16=4,125.

The fixed frequency divider M divides the 25.6 MHz signal produced by the reference oscillator OSC to 400 kHz, and the reference signal generator 2 outputs a plurality of reference signals FR1 to FR16 having different phases. The reference signals FR1 to FR16 have a reference frequency of 25 kHz, and rise at time points T1 to T16, respectively (see FIG. 2).

The first variable frequency divider 4 divides the output signal VO of the voltage-controlled oscillator VCO by a division factor of N=66,000 to produce a feedback signal FP1, and feeds the feedback signal FP1 (see FIG. 2) to the first phase comparator PC1.

The second variable frequency divider 8 divides the output signal VO by a division factor of N/n=4,125 to produce feedback signals FP2 to FP16, and feeds the feedback signals FP2 to FP16 (see FIG. 2) to the second phase comparator PC2.

The first phase comparator PC1 performs phase comparison between the reference signal FR1 and the feedback signal FP1, and feeds phase comparison signals U1 and D1 to the first charge pump CP1. Based on the phase comparison signals U1 and D1, the first charge pump CP1 feeds a first output voltage ER1 to the low-pass filter LPF. Based on the first output voltage ER1, the low-pass filter LPF feeds a control voltage CV to the voltage-controlled oscillator VCO.

Next, the second phase comparator PC2 performs phase comparison between the reference signals FR2 to FR16 and the feedback signals FP2 to FP16, respectively, and feeds phase comparison signals U2 to U16 and D2 to D16 to the second charge pump CP2.

Based on those phase comparison signals, the second charge pump CP2 feeds a second output voltage ER2 to the low-pass filter LPF. Based on the second output voltage ER2, the low-pass filter LPF feeds a control voltage CV to the voltage-controlled oscillator VCO. As a result, the output signal VO output from the voltage-controlled oscillator VCO comes closer to the preset frequency. This sequence of phase comparison operations is repeated.

In this configuration, phase comparison is performed 16 times during one period (TR) of the reference signal FR1 (see FIG. 2). Thus, the lock-up time (the time required for the output signal VO to substantially synchronize with the preset frequency) is reduced to about 1/16 of that experienced in a conventional configuration with a single phase comparator.

This is how the first variable frequency divider 4, first phase comparator PC1, first charge pump CP1, second variable frequency divider 8, second phase comparator PC2, second charge pump CP2, and other components operate when synchronism is yet to be achieved (i.e., while the lock detector 11 is feeding a low signal to the controller 6).

As the sequence of phase comparison operations described above is repeated, the output signal VO ultimately comes into synchronism with the preset frequency. Specifically, at this time, the frequency of the output signal VO has come within ±300 Hz of the preset frequency. Now, the lock detector 11 feeds the controller 6 with a high signal (a synch detect signal).

Now that a steady state is established, in response to the synch detect signal, the controller 6 stops the operation of the second variable frequency divider 8, stops the operation of the second phase comparator PC2, and stops the operation of the second charge pump CP2.

On the other hand, in the steady state, the controller 6 keeps the first variable frequency divider 4 operating, and keeps the first phase comparator PC1 and the first charge pump CP1 operating. That is, the controller 6 keeps the first PLL frequency synthesizer 7 operating and stops the operation of the second PLL frequency synthesizer 10.

In this way, when the steady state is established in response to the synch detect signal, the controller 6 keeps the first PLL frequency synthesizer 7 operating. This ensures accurate frequency division and phase comparison operations. Thus, it is possible to stably output the output signal VO having the preset frequency 1.65 GHz.

On the other hand, when the steady state is established in response to the synch detect signal, the controller 6 stops the operation of the second variable frequency divider 8, second phase comparator PC2, and second charge pump CP2. This helps reduce the electric power consumption of the PLL circuit 1.

The following is a summary of the features of the operations described above. When the output signal comes into synchronism with the preset frequency, at least one variable frequency divider 4 is kept operating, and the operation of the other variable frequency divider 8 is stopped.

That is, in a search state, in which synchronism is yet to be detected, both the first and second variable frequency dividers 4 and 8 are kept operating. When synchronism is detected, while the first variable frequency divider 4 is kept operating, the operation of the second variable frequency divider 8 is stopped.

<Second Embodiment>

Figure 3:
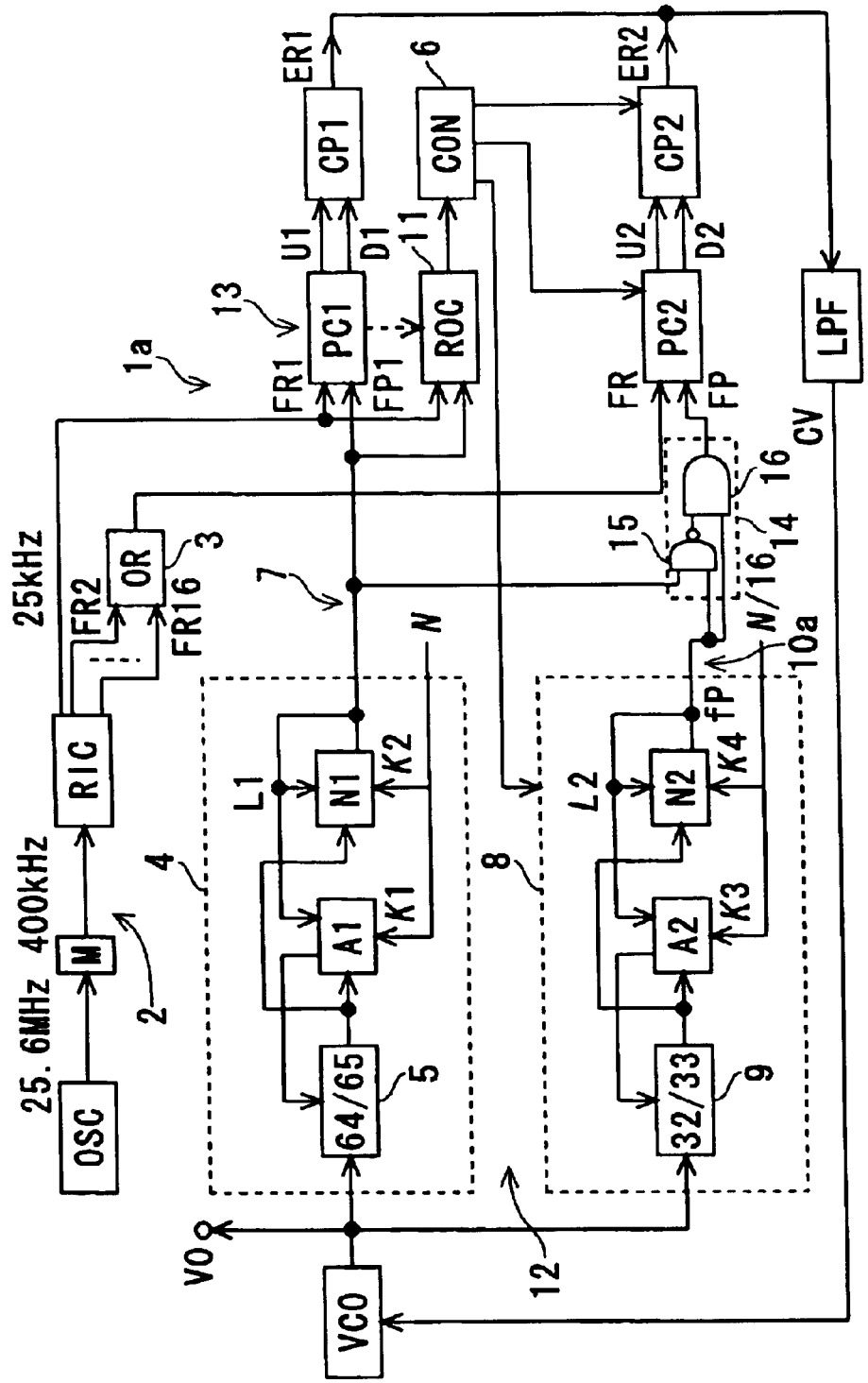
FIG. 3 is a block diagram of a PLL circuit embodying the invention.
Figure 4:
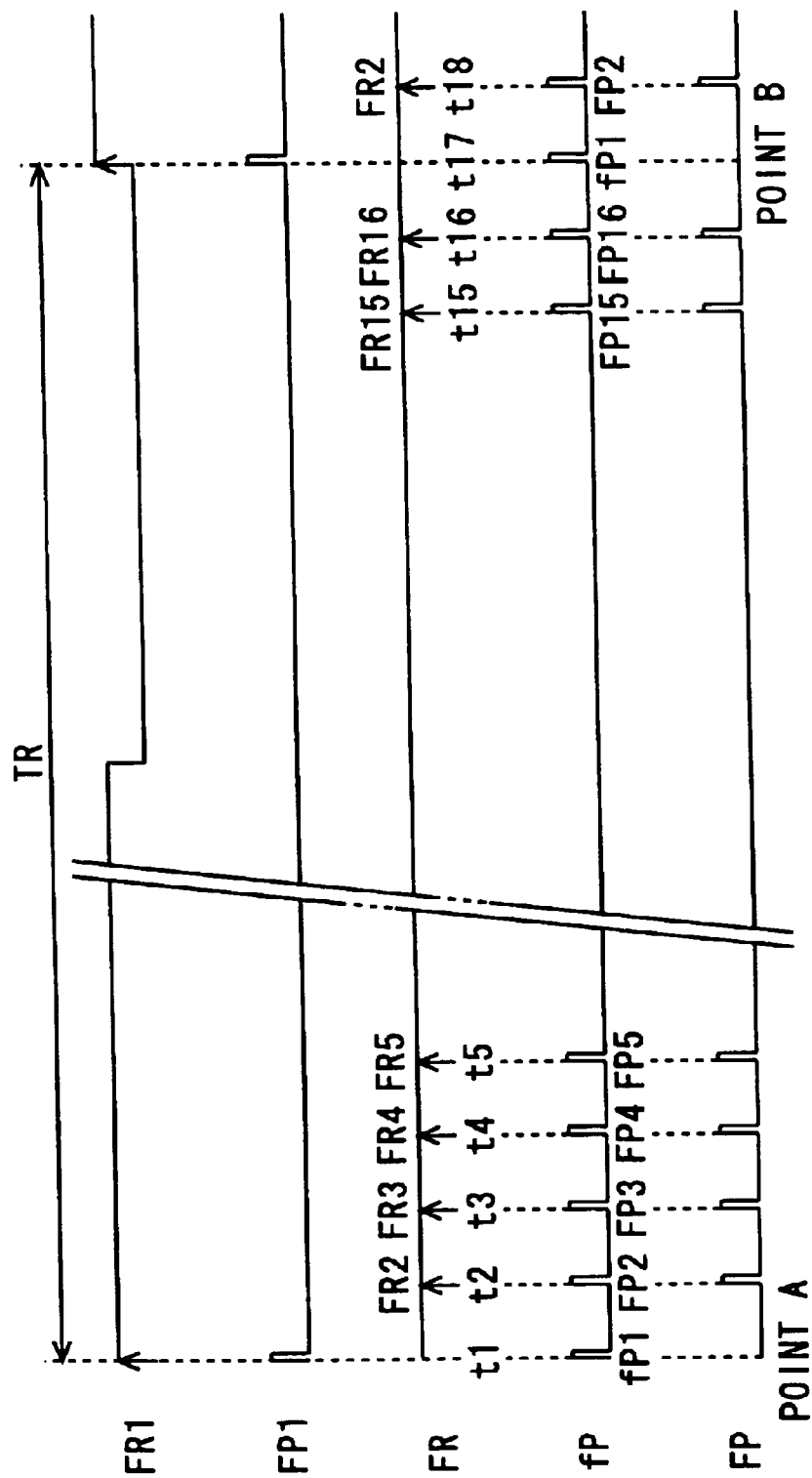
FIG. 4 is a time chart of the relevant signals used in the PLL circuit shown in FIG. 3.

Hereinafter, with reference to FIGS. 3 and 4, the PLL circuit 1a of a second embodiment of the invention will be described. FIG. 3 is a block diagram of the PLL circuit 1a, and FIG. 4 is a time chart of the relevant signals used in the PLL circuit 1a. It is to be noted that such components as are found also in the PLL circuit 1 of the first embodiment are identified with the same reference numerals and symbols, and their detailed explanations will not be repeated.

The PLL circuit 1a shown in FIG. 3 is realized by adding a signal eliminator 14 to the PLL circuit 1 (FIG. 1) of the first embodiment including the reference signal generator 2, first variable frequency divider 4, controller 6, second variable frequency divider 8, lock detector 11, phase comparator 13, low-pass filter LPF, and voltage-controlled oscillator VCO.

In this embodiment, the reference signal FR1 is referred to as the "first reference signal FR1," and the reference signals FR2 to FR16 output from the OR gate 3 are referred to as the "second reference signal FR." Thus, the reference signal generator 2 produces a first reference signal FR1 and a second reference signal FR.

The first variable frequency divider 4 is fed with a division factor N calculated by the controller 6, which is connected to the frequency setting keys (not shown). That is, the first variable frequency divider 4 is set to perform frequency division by a division factor of N, which is the value obtained by dividing the preset frequency by the reference frequency. Thus, a first feedback signal FP1 produced by dividing the output signal VO of the voltage-controlled oscillator VCO by a division factor of N is fed to the other input terminal of the first phase comparator PC1. The first phase comparator PC1 performs phase comparison between the first reference signal FR1 and the first feedback signal FP1, and feeds phase comparison signals U1 and D1 to the first charge pump CP1.

Based on those phase comparison signals U1 and D1, the first charge pump CP1 produces a first output voltage ER1. The low-pass filter LPF, by eliminating high-frequency components contained in the first output voltage ER1, procures a control voltage CV, and feeds it to the voltage-controlled oscillator VCO. Thus, as in the first embodiment, the reference signal generator 2, first phase comparator PC1, first charge pump CP1, low-pass filter LPF, voltage-controlled oscillator VCO, first variable frequency divider 4, and other components together constitute a first PLL frequency synthesizer 7.

Assuming that the total number of reference signals FR1 to FR16 is n, the second variable frequency divider 8 is set to perform frequency division by a division factor of N/n. Here, the second reference signal FR is the OR of (n−1) reference signals, namely FR2 to FR16. Thus, the second variable frequency divider 8 divides the output signal VO of the voltage-controlled oscillator VCO by a division factor of N/n, and outputs a second feedback signal fp consisting of 16 high signals (feedback signals) fp1 and FP2 to FP16 per period TR.

The second reference signal FR, which is the OR of the (n−1) reference signals FR2 to FR16 produced by the reference signal generator 2 and having different phases, is fed to one input terminal of the second phase comparator PC2.

The output terminals of the first and second variable frequency dividers 4 and 8 are connected to the input terminals of the signal eliminator 14. The output terminal of the signal eliminator 14 is connected to the other input terminal of the second phase comparator PC2.

The signal eliminator 14 is configured as a logic circuit composed of, for example, a NAND gate 15 and an AND gate 16. The NAND gate 15 receives, at one input terminal thereof, the first feedback signal FP1 and, at the other input terminal thereof, the second feedback signal fp.

The AND gate 16 receives, at one input terminal thereof, the output of the NAND gate 15 and, at the other input terminal, the second feedback signal fp. The output of the AND gate 16 is fed to the other input terminal of the second phase comparator PC2.

When the first feedback signal FP1 is low and the second feedback signal fp is low, the signal eliminator 14 outputs a low signal (this state is called the first state). When the first feedback signal FP1 is low and the second feedback signal fp is high, the signal eliminator 14 outputs a high signal (this state is called the second state).

When the first feedback signal FP1 is high and the second feedback signal fp is low, the signal eliminator 14 outputs a low signal (this state is called the third state). When the first feedback signal FP1 is high and the second feedback signal fp is high, the signal eliminator 14 outputs a low signal (this state is called the fourth state).

In this way, while the first feedback signal FP1 is being output (i.e., when the first feedback signal FP1 is high), the signal eliminator 14 eliminates the output fp1 of the second feedback signal fp (i.e., prevents the signal fp from becoming high). This produces a third feedback signal FP that is low at time points A and B.

The signal obtained in this way by converting the second feedback signal fp in such a way that its output fp1 is low when the first feedback signal FP1 is high is called the third feedback signal FP.

Moreover, as in the second state mentioned above, when the first feedback signal FP1 is low and the second feedback signal fp is high, the signal eliminator 14 outputs the second feedback signal fp as a high signal. As a result, the third feedback signal FP is low at time points A, B, and similar points (i.e., when the first feedback signal FP1 is high). In other respects, the third feedback signal FP has the same waveform as the second feedback signal fp.

In this way, the second phase comparator PC2 receives the second reference signal FR and the third feedback signal FP.

The second phase comparator PC2 performs phase comparison between the constituent signals of the second reference signal (the OR of the reference signals FR2 to FR16) and those of the third feedback signal FP (consisting of the feedback signals FP2 to FP16), respectively, and feeds phase comparison signals U2 and D2 to the second charge pump CP2.

Based on those phase comparison signals U2 and D2, the second charge pump CP2 produces a second output voltage ER2. The low-pass filter LPF, by eliminating high-frequency components contained in the second output voltage ER2, produces a control voltage CV, and feeds it to the voltage-controlled oscillator VCO. Thus, the reference signal generator 2, second phase comparator PC2, second charge pump CP2, low-pass filter LPF, voltage-controlled oscillator VCO, second variable frequency divider 8, signal eliminator 14, and other components together constitute a second PLL frequency synthesizer 10a.

Now, the operation of the PLL circuit 1a configured as described above will be described. First, suppose, for example, that, as in the first embodiment, the user sets the preset frequency at 1.65 GHz with the frequency setting keys and then presses a start key.

The controller 6 feeds the first variable frequency divider 4 with a division factor N=66,000. Simultaneously, the controller 6 feeds the second variable frequency divider 8 with a division factor N/n=66,000/16=4,125.

The fixed frequency divider M divides the oscillation signal (25.6 MHz) from the reference oscillator OSC to 400 kHz, and the reference signal generator 2 outputs a plurality of reference signals FR1 to FR16 having different phases. The reference signals FR1 to FR16 have a reference frequency of 25 kHz, and rise at time points t1 to t16, respectively (see FIG. 4).

The first variable frequency divider 4 divides the output signal VO of the voltage-controlled oscillator VCO by a division factor of N=66,000 to produce a first feedback signal FP1, and feeds the first feedback signal FP1 (see FIG. 4) to the first phase comparator PC1.

The second variable frequency divider 8 divides the output signal VO by a division factor of N/n=4,125 to produce a second feedback signal fp. While the first feedback signal FP1 is being output, the signal eliminator 14 eliminates the output fp1 of the second feedback signal fp, and thereby converts the second feedback signal fp into a third feedback signal FP.

The first phase comparator PC1 performs phase comparison between the first reference signal FR1 and the first feedback signal FP1, and feeds phase comparison signals U1 and D1 to the first charge pump CP1. Based on the phase comparison signals U1 and D1, the first charge pump CP1 feeds a first output voltage ER1 to the low-pass filter LPF. Based on the first output voltage ER1, the low-pass filter LPF feeds a control voltage CV to the voltage-controlled oscillator VCO.

Next, the second phase comparator PC2 performs phase comparison between the constituent signals of the second reference signal FR and those of the third feedback signal FP, respectively, and feeds phase comparison signals U2 and D2 to the second charge pump CP2. Based on those phase comparison signals, the second charge pump CP2 feeds a second output voltage ER2 to the low-pass filter LPF. Based on the second output voltage ER2, the low-pass filter LPF feeds a control voltage CV to the voltage-controlled oscillator VCO. As a result, the output signal VO output from the voltage-controlled oscillator VCO comes closer to the preset frequency. This sequence of phase comparison operations is repeated.

In this configuration, phase comparison is performed 16 times during one period (TR) of the first reference signal FR1 (see FIG. 4). Thus, the lock-up time (the time required for the output signal VO to substantially synchronize with the preset frequency) is reduced to about $\frac{1}{16}$ of that experienced in a conventional configuration with a single phase comparator.

This is how the first variable frequency divider 4, first phase comparator PC1, first charge pump CP1, second variable frequency divider 8, second phase comparator PC2, second charge pump CP2, and other components operate when synchronism is yet to be achieved (i.e., while the lock detector 11 is feeding a low signal to the controller 6).

As the sequence of phase comparison operations described above is repeated, the output signal VO ultimately comes into synchronism with the preset frequency. Specifically, at this time, the frequency of the output signal VO has come within ±300 Hz of the preset frequency. Now (in a steady state), the lock detector 11 feeds the controller 6 with a high signal (a synch detect signal).

Now that the steady state is established, in response to the synch detect signal, the controller 6 stops the operation of the second variable frequency divider 8, stops the operation of the second phase comparator PC2, and stops the operation of the second charge pump CP2.

On the other hand, in the steady state, the controller 6 keeps the first variable frequency divider 4 operating, and keeps the first phase comparator PC1 and the first charge pump CP1 operating. That is, the controller 6 keeps the first PLL frequency synthesizer 7 operating and stops the operation of the second PLL frequency synthesizer 10a.

In this way, in response to the synch detect signal (i.e., in the steady state), the controller 6 keeps the first PLL frequency synthesizer 7 operating. This ensures accurate frequency division and phase comparison operations. Thus, it is possible to stably output the output signal VO having the preset frequency 1.65 GHz.

On the other hand, in response to the synch detect signal (i.e., in the steady state), the controller 6 stops the operation of the second variable frequency divider 8, second phase comparator PC2, and second charge pump CP2. This helps reduce the electric power consumption of the PLL circuit 1a.

<Third Embodiment>

Figure 5:
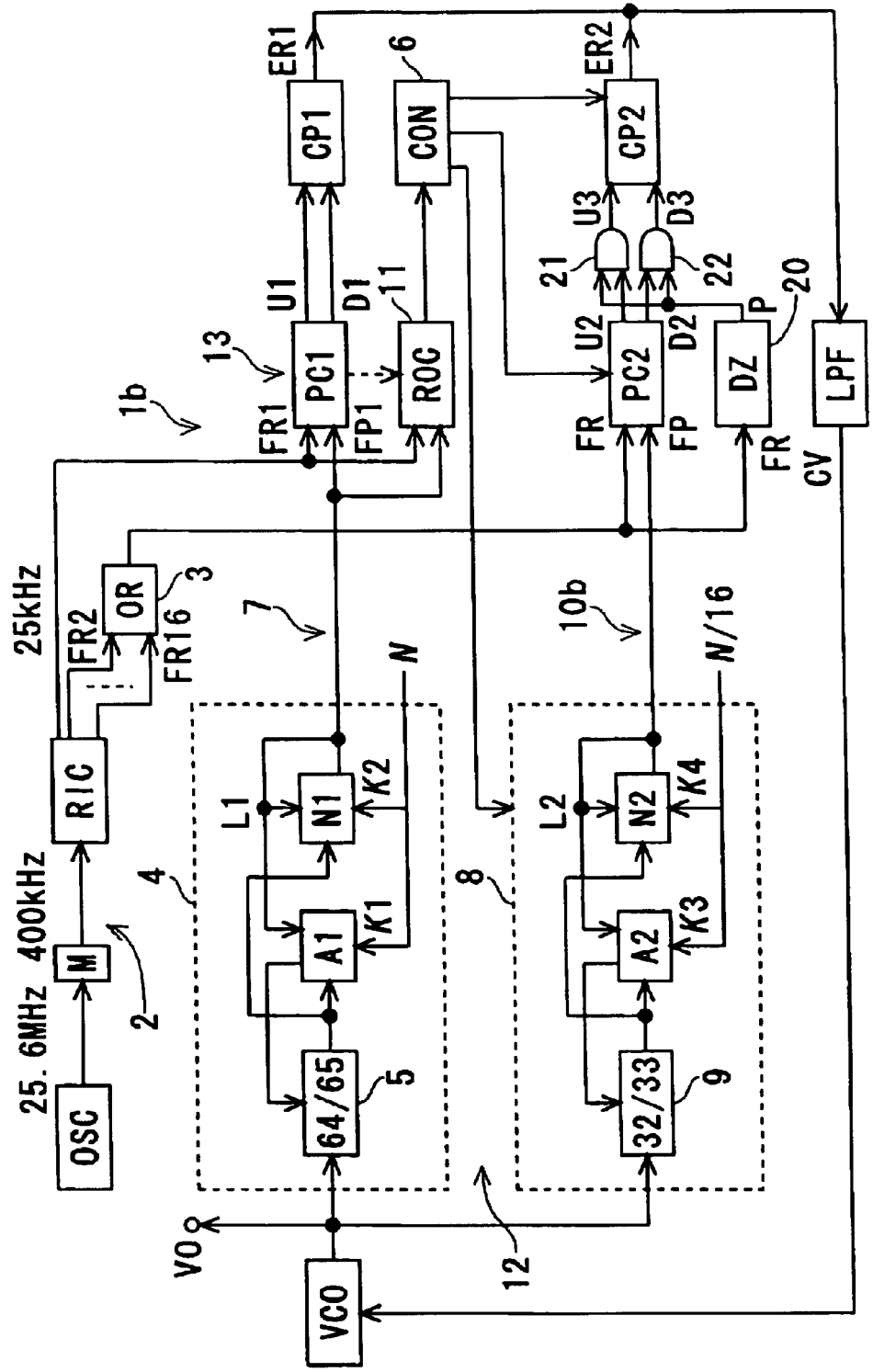
FIG. 5 is a block diagram of a PLL circuit embodying the invention.
Figure 6:
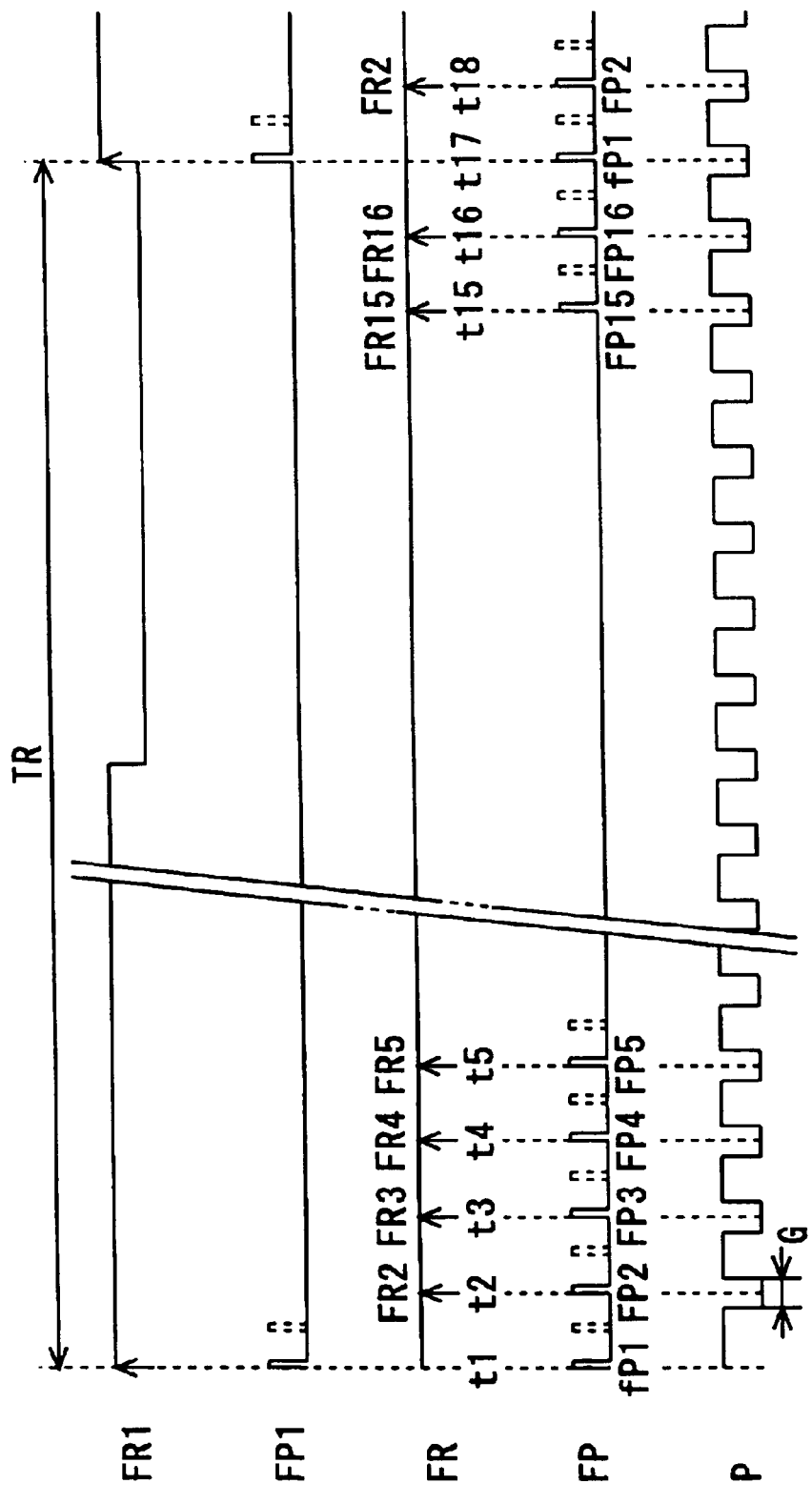
FIG. 6 is a time chart of the relevant signals used in the PLL circuit shown in FIG. 5.

Hereinafter, with reference to FIGS. 5 and 6, the PLL circuit 1b of a third embodiment of the invention will be described. FIG. 5 is a block diagram of the PLL circuit 1b, and FIG. 6 is a time chart of the relevant signals used in the PLL circuit 1b. It is to be noted that such components as are found also in the PLL circuits 1 and 1a of the first and second embodiments are identified with the same reference numerals and symbols, and their detailed explanations will not be repeated.

The PLL circuit 1b shown in FIG. 5 is realized by adding a generator 20 and AND gates 21 and 22 to the PLL circuit 1 (FIG. 1) of the first embodiment including the reference signal generator 2, first variable frequency divider 4, controller 6, second variable frequency divider 8, lock detector 11, phase comparator 13, low-pass filter LPF, and voltage-controlled oscillator VCO. Here, the reference signal generator 2 produces a first reference signal FR1 and a second reference signal FR.

For example, suppose that the user has set the preset frequency at 1,650,025 kHz by operating frequency setting keys (not shown). Then, the first variable frequency divider 4 is fed with a division factor calculated by the controller 6, namely a division factor N=1,650,025 kHz/25 kHz=66,001. Based on this division factor N, the controller 6 then calculates the number of times K1 that the swallow counter A1 should operate and the number of times K2 that the course counter N1 should operate, and sets the calculated numbers K1 and K2 in those counters, respectively (for example, K1=17 and K2=1,031).

In this way, a first feedback signal FP1 obtained by dividing the output signal VO of the voltage-controlled oscillator VCO by a division factor of N is fed to the other input terminal of the first phase comparator PC1. The first phase comparator PC1 performs phase comparison between the first reference signal FR1 and the first feedback signal FP1, and feeds phase comparison signals U1 and D1 to the first charge pump CP1.

Based on those phase comparison signals U1 and D1, the first charge pump CP1 produces a first output voltage ER1. The low-pass filter LPF, by eliminating high-frequency components contained in the first output voltage ER1, produces a control voltage CV, and feeds it to the voltage-controlled oscillator VCO. Thus, the reference signal generator 2, first phase comparator PC1, first charge pump CP1, low-pass filter LPF, voltage-controlled oscillator VCO, first variable frequency divider 4, and other components together constitute a first PLL frequency synthesizer 7.

When the first variable frequency divider 4 is fed with the previously determined division factor as described above, assuming that the total number of reference signals FR1 to FR16 is n, the second variable frequency divider 8 is set to perform frequency division by a division factor of N/n. Thus, for example, when n=16, the controller 6 feeds the second variable frequency divider 8 with a division factor equal to the integer part of N/16. When N=66,000 as described above, then N/n=66,001/16=4,125+$\frac{1}{16}$. Thus, the division factor N/n is composed of an integer part (for example, 4,125) and a remainder part (for example $\frac{1}{16}$). In this case, the second variable frequency divider 8 performs frequency division by a division factor equal to the integer part, namely 4,125.

Instead, for example, when N=66,000, then N/n=66,000/16=4,125. In this case, the second variable frequency divider 8 performs frequency division by a division factor of 4,125. That is, when N is an integral multiple of n, the second variable frequency divider 8 is set to perform frequency division by a division factor of N/n.

In the following descriptions, it is assumed that N=66,001, and therefore that the second variable frequency divider 8 performs frequency division by a division factor of 4,125. Based on this division factor 4,125, the controller 6 then calculates the number of times K3 that the swallow counter A2 should operate and the number of times K4 that the course counter N2 should operate, and sets the calculated numbers K3 and K4 in those counters, respectively (for example, K3=29 and K4=128). In this way, the second variable frequency divider 8 divides the output signal VO of the voltage-controlled oscillator VCO by a division factor equal to the integer part of N/n, and outputs a second feedback signal FP consisting of 16 high signals (feedback signals; see the portions indicated by broken lines and marked FP in FIG. 6) fp1 and FP2 to FP16 per period TR.

Thus, the second phase comparator PC2 receives, at one input terminal thereof, the second reference signal FR, which is the OR of the (n−1) reference signals FR2 to FR16 produced by the reference signal generator 2 and having different phases, and, at the other input terminal thereof, the second feedback signal FP output from the second variable frequency divider 8. The second phase comparator PC2 performs phase comparison between the second feedback signal FP and the second reference signal FR, and outputs phase comparison signals U2 and D2.

As described above, there are provided a plurality of variable frequency dividers 4 and 8 that divide the output signal VO of the voltage-controlled oscillator VCO to output feedback signals FP1 and FP. The phase comparator 13 performs phase comparison between the feedback signals FP1 and FP and the reference signals FR1 and FR, respectively.

The generator 20 is configured, for example, as a pulse generator circuit, and serves to generate a signal P (see FIG. 5) that determines nonresponsive periods G (see FIG. 6).

The input terminal of the generator 20 is connected to the output terminal of the OR gate 3 to receive the second reference signal FR. The output terminal of the generator 20 is connected commonly to one input terminal of each of the AND gates 21 and 22.

The other input terminal of the AND gate 21 is connected to one output terminal of the second phase comparator PC2 to receive the pump-up signal U2. The output terminal of the AND gate 21 is connected to one input terminal of the second charge pump CP2.

The other input terminal of the AND gate 22 is connected to the other output terminal of the second phase comparator PC2 to receive the pump-down signal D2. The output terminal of the AND gate 22 is connected to the other input terminal of the second charge pump CP2.

As described above, the generator 20 receives the second reference signal FR. The generator 20 produces the signal P according to the second reference signal FR, which is fed to the second phase comparator PC2.

The generator 20 produces the signal P, for example, in such a way that it produces nonresponsive periods extending equally to the left and right sides of each of the rising edges FR2, FR3, . . . , and FR16 (see FIG. 6) of the second reference signal FR, and feeds the thus produced signal P to the AND gates 21 and 22.

The AND gate 21 calculates the AND of the phase comparison signal U2 from the second phase comparator PC2 and the signal P, and the AND gate 22 calculates the AND of the phase comparison signal D2 from the second phase comparator PC2 and the signal P. The AND gates 21 and 22 then feed the resulting signals as AND signals U3 and D3, respectively, to the second charge pump CP2. Based on those AND signals U3 and D3, the second charge pump CP2 produces a second output voltage ER2, and feeds it to the low-pass filter LPF.

The low-pass filter LPF, by eliminating high-frequency components contained in the second output voltage ER2, produces a control voltage CV, and feeds it to the voltage-controlled oscillator VCO. Thus, the reference signal generator 2, second phase comparator PC2, generator 20, AND gates 21 and 22, second charge pump CP2, low-pass filter LPF, voltage-controlled oscillator VCO, second variable frequency divider 8, and other components together constitute a second PLL frequency synthesizer 10b.

Now, the operation of the PLL circuit 1b configured as described above will be described. First, suppose, for example, that the user sets the preset frequency at 1,650,025 kHz with the frequency setting keys and then presses a start key.

The controller 6 feeds the first variable frequency divider 4 with a division factor N=1,650,025 kHz/25 kHz=66,001.

Simultaneously, the controller 6 feeds the second variable frequency divider 8 with a division factor equal to the integer part of N/n, namely 4,125.

The fixed frequency divider M divides the oscillation signal (25.6 MHz) from the reference oscillator OSC to 400 kHz, and the reference signal generator 2 outputs a plurality of reference signals FR1 to FR16 having different phases. The reference signals FR1 to FR16 have a reference frequency of 25 kHz, and rise at time points t1 to t16, respectively (see FIG. 6).

The first variable frequency divider 4 divides the output signal VO of the voltage-controlled oscillator VCO by a division factor of N=66,001 to produce a first feedback signal FP1, and feeds the first feedback signal FP1 to the first phase comparator PC1. Here, since the output signal VO has a frequency deviated from the preset frequency, the first feedback signal FP1 looks like FP1 indicated by broken lines in FIG. 6.

The first phase comparator PC1 performs phase comparison between the first reference signal FR1 and the first feedback signal FP1 (broken lines), and feeds phase comparison signals U1 and D1 to the first charge pump CP1.

Based on those phase comparison signals U1 and D1, the first charge pump CP1 feeds a first output voltage ER1 to the low-pass filter LPF. Based on the first output voltage ER1, the low-pass filter LPF feeds a control voltage CV to the voltage-controlled oscillator VCO.

On the other hand, the second variable frequency divider 8 divides the output signal VO by a division factor equal to the integer part of N/16 (4,125) to produce a second feedback signal FP (consisting of high signals fp1 and FP2 to FP16). Here, since the output signal VO has a frequency deviated from the preset frequency, the second feedback signal FP looks like FP indicated by broken lines in FIG. 6.

Next, the second phase comparator PC2 performs phase comparison between the constituent signals of the second reference signal FR and those of the second feedback signal FP, respectively, and feeds phase comparison signals U2 and D2 to the AND gates 21 and 22.

Specifically, the second phase comparator PC2 performs phase comparison between the rising edge FR2 of the second reference signal FR and the high signal (feedback signal) FP2 (broken lines) in the second feedback signal FP, and outputs phase comparison signals U2 and D2. Likewise, the second phase comparator PC2 performs phase comparison between the rising edge FRA (where A is an integer in the range from 3 to 16) of the second reference signal FR and the high signal (feedback signal) FPA (where A is an integer in the range from 3 to 16; FPA indicated by broken lines) in the second feedback signal FP, and outputs phase comparison signals U2 and D2.

Here, as described above, the second variable frequency divider 8 performs phase comparison by a division factor equal to the integer part of N/16 (for example, 4,125), which is not equal to the exact division factor N/16 (for example, 4,125.0625). Thus, here, the second phase comparator PC2 performs phase comparison between the second feedback signal FP containing an error from the exact division factor and the second reference signal FR, and outputs the phase comparison signals U2 and D2. Accordingly, the phase comparison signals U2 and D2 are error signals that reflect that error.

Moreover, here, the generator 20 feeds the signal P (high at this particular moment) to the AND gates 21 and 22. The high signals in the signal P and the phase comparison signals U3 and D3 resulting from the high signals in the second feedback signal FP (i.e., portions of FP2 to FP16 indicated by broken lines) are subjected to an AND operation by the AND gates 21 and 22 to produce AND signals U3 and D3.

Based on those AND signals U3 and D3, the second charge pump CP2 feeds a second output voltage ER2 to the low-pass filter LPF. Based on the second output voltage ER2, the low-pass filter LPF feeds a control voltage CV to the voltage-controlled oscillator VCO.

In this way, when the PLL circuit 1 is in the searching state, the second phase comparator PC2 passes error signals to the succeeding stage (i.e., it outputs error signals to the second charge pump CP2). In the searching state, the frequency of the output signal VO is deviated from the preset frequency, and therefore letting the second phase comparator PC2 output error signals does not cause any problem in practice.

In this configuration, phase comparison is performed 16 times during one period TR of the first reference signal FR1 (see FIG. 6). Thus, the lock-up time (the time required for the output signal VO to substantially reach the preset frequency) is reduced to about 1/16 of that experienced in a conventional configuration with a single phase comparator.

As the sequence of phase comparison operations described above is repeated, the output signal VO becomes close to the preset frequency (this state is called the almost steady state).

In the almost steady state, the first feedback signal FP1 looks like FP1 indicated by solid lines in FIG. 6, being close to the first reference signal FR1 (with their phase difference diminished).

The first phase comparator PC1 performs phase comparison between the first reference signal FR1 and the first feedback signal FP1 (solid lines), and feeds phase comparison signals U1 and D1 to the first charge pump CP1.

Based on those phase comparison signals U1 and D1, the first charge pump CPI feeds a first output voltage ER1 to the low-pass filter LPF. Based on the first output voltage ER1, the low-pass filter LPF feeds a control voltage CV to the voltage-controlled oscillator VCO. As a result, the frequency of the output signal VO becomes still closer to the preset frequency.

On the other hand, the second feedback signal FP looks like FP2 to FP16 indicated by solid lines in FIG. 6, being close to the rising edges FR2 to FR16 of the second reference signal FR.

Next, the second phase comparator PC2 performs phase comparison between the rising edge FR2 of the second reference signal FR and the high signal FP2 (solid lines) in the second feedback signal FP, and outputs phase comparison signals U2 and D2.

Likewise, the second phase comparator PC2 performs phase comparison between the rising edge FRA (where A is an integer in the range from 3 to 16) of the second reference signal FR and the high signal FPA (where A is an integer in the range from 3 to 16; FPA indicated by solid lines) in the second feedback signal FP, and outputs phase comparison signals U2 and D2. Here, as described earlier, the phase comparison signals U2 and D2 are error signals containing an error from the exact division factor.

Moreover, while a high signal is being output as the second feedback signal FP (solid lines), the generator 20 outputs the signal P (low at this particular moment) to the AND gates (see FIG. 6). The low signals in the signal P and the phase comparison signals U2 and D2 resulting from the high signals (i.e., portions of FP2 to FP16 indicated by solid lines) are subjected to an AND operation by the AND gates 21 and 23 to produce AND signals U3 and D3, which are low signals.

Based on those AND signals U3 and D3 (low), the second charge pump CP2 feeds a second output voltage ER2 (low) to the low-pass filter LPF. Based on the second output voltage ER2 (low), the low-pass filter LPF feeds a control voltage CV (low) to the voltage-controlled oscillator VCO.

In this way, when the PLL circuit 1 is in the almost steady state, the second phase comparator PC2, which is connected to the second variable frequency divider 8, outputs low signals because of the low signal fed to the AND gates 21 and 22. That is, the signal P prevents the second phase comparator PC2 from passing (outputting) error signals to the succeeding stage (i.e., the second charge pump CP2 and the components following it).

In other words, the second phase comparator PC2 does not pass error signals containing an error ascribable to the remainder part of N/16 (in the example being described, 1/16) to the succeeding stage. That is, in the almost steady state, no error signals are used to control the voltage-controlled oscillator VCO.

In this way, while the second PLL frequency synthesizer 10b does not feed error signals to the voltage-controlled oscillator VCO, the first PLL frequency synthesizer 7 continues the phase synchronization operations described above.

As the first PLL frequency synthesizer 7 repeats the sequence of phase comparison operations described above, the frequency of the output signal VO comes within ±300 Hz of the preset frequency. This state is called the steady state.

In the steady state also, the second PLL frequency synthesizer 10b does not use error signals to control (i.e., does not feed them to) the voltage-controlled oscillator VCO.

When the steady state is established in this way, the lock detector 11 feeds a high signal (a synch detect signal) to the controller 6. In response to the synch detect signal, the controller 6 stops the operation of the second variable frequency divider 8, stops the operation of the second phase comparator PC2, and stops the operation of the second charge pump CP2.

On the other hand, in response to the synch detect signal, the controller 6 keeps the first variable frequency divider 4 operating and keeps the first PLL frequency synthesizer 7 operating, but stops the operation of the second PLL frequency synthesizer 10b.

As described above, when the PLL circuit 1b is in the almost steady state and in the steady state, no error signals are fed to the voltage-controlled oscillator VCO.

Accordingly, the first feedback signal FP1, which results from exact frequency division by the first variable frequency divider 4 by a division factor of N in the first PLL frequency synthesizer 7, contains no error. Thus, the first phase comparator PC1 performs phase comparison between the exact first feedback signal FP1 containing no error and the first reference signal FR1.

Accordingly, the first phase comparator PC1 feeds exact phase comparison signals U1 and D1 containing no error to the first charge pump CP1. As a result, an exact control voltage CV containing no error is fed through the low-pass filter LPF to the voltage-controlled oscillator VCO.

In this way, in the steady state, the voltage-controlled oscillator VCO can stably output the output signal VO having exactly the preset frequency 1,650,025 kHz.

<Fourth Embodiment>

Figure 7:
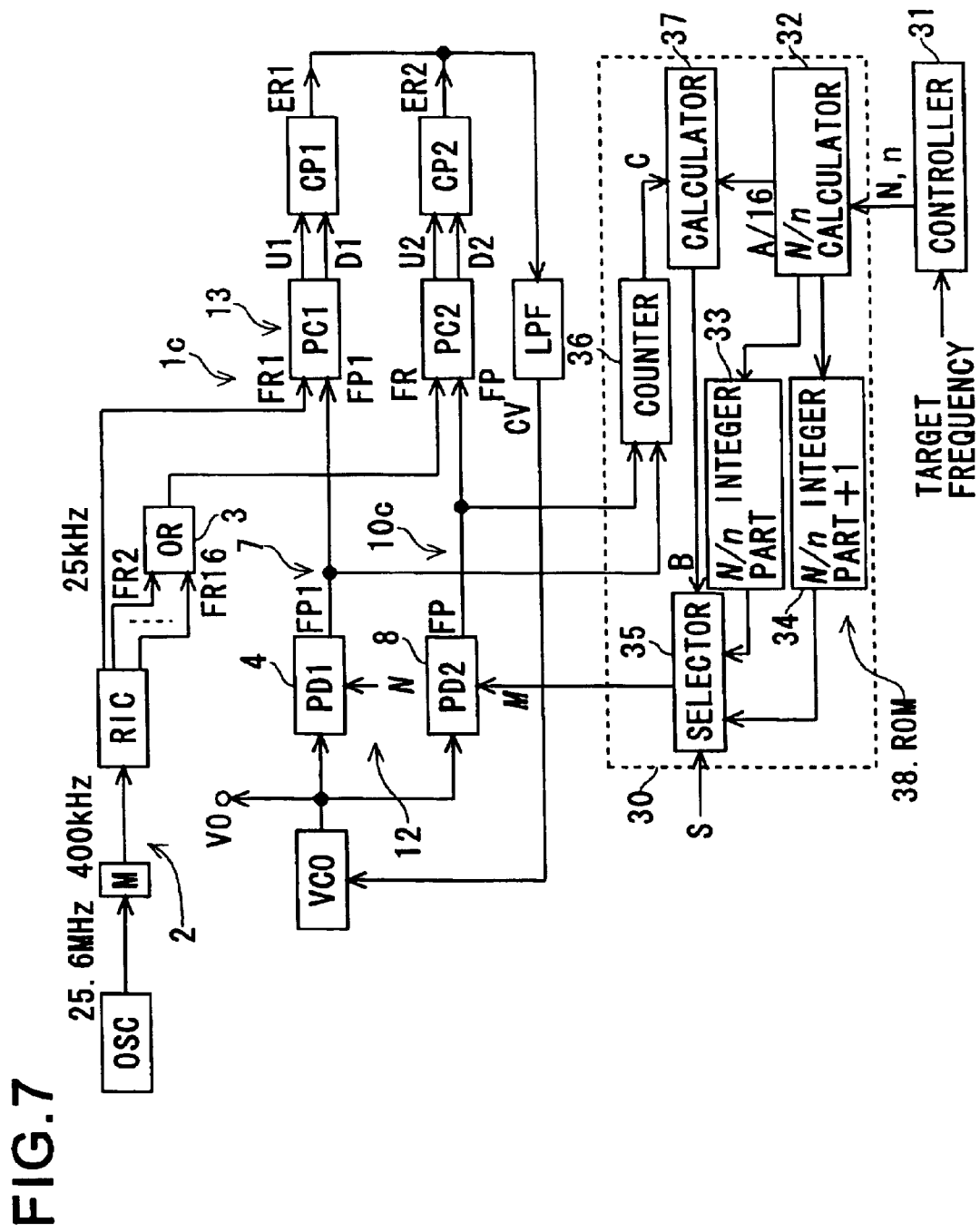
FIG. 7 is a block diagram of a PLL circuit embodying the invention.
Figure 8:
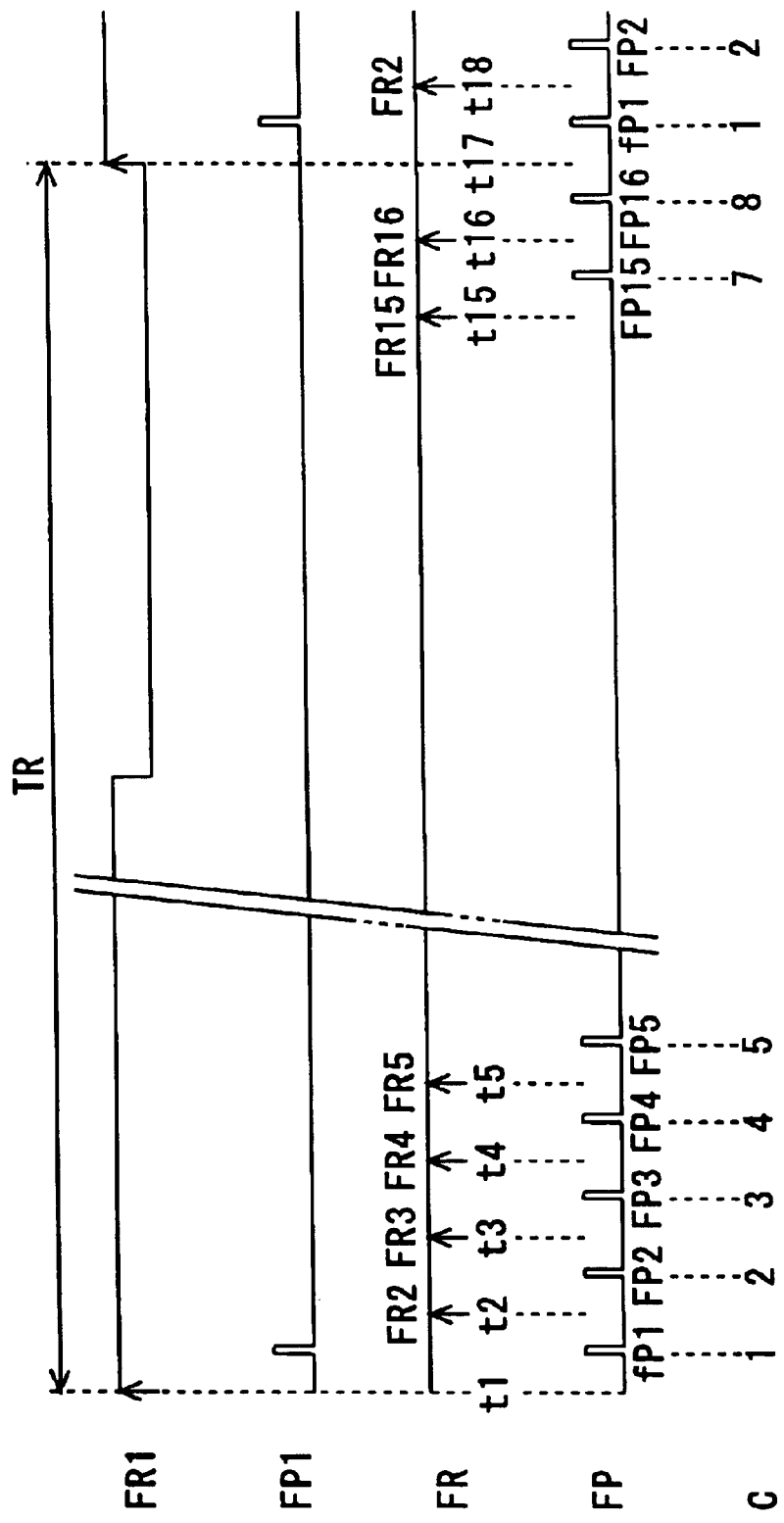
FIG. 8 is a time chart of the relevant signals used in the PLL circuit shown in FIG. 7.

Hereinafter, with reference to FIGS. 7 and 8, the PLL circuit 1c of a fourth embodiment of the invention will be described. FIG. 7 is a block diagram of the PLL circuit 1c, and FIG. 8 is a time chart of the relevant signals used in the PLL circuit 1c. It is to be noted that such components as are found also in the PLL circuits 1, 1a, and 1b of the first, second, and third embodiments are identified with the same reference numerals and symbols, and their detailed explanations will not be repeated.

The PLL circuit 1c shown in FIG. 7 includes a reference signal generator 2, a phase comparator 13, a low-pass filter LPF, and a voltage-controlled oscillator VCO configured in the same manner as in the first to third embodiments, and incorporates a first variable frequency divider 4 and a second variable frequency divider 8 configured in the same manner as in the first to third embodiments, though their configurations are not illustrated here. The PLL circuit 1c lacks a lock detector 11 but instead includes a scattering circuit 30 and a controller 31.

Suppose, for example, that the user has set the preset frequency at 1,650,050 kHz by operating frequency setting keys (not shown). Then, the controller 31 (composed of a microcomputer and other components), which is connected to the frequency setting keys, calculates the division factor N by which the first variable frequency divider 4 should perform frequency division, and outputs the calculated division factor N to the first variable frequency divider 4. Specifically, N=1,650,050 kHz/25 kHz=66,002 (since the reference frequency is 25 kHz). That is, the first variable frequency divider 4 is set to perform frequency division by a division factor of N, which is the value obtained by dividing the preset frequency by the reference frequency.

Based on the above division factor N, the controller 31 then calculates the number of times K1 that the swallow counter A1 should operate and the number of times K2 that the course counter N1 should operate, and sets the calculated numbers K1 and K2 in those counters, respectively (for example, K1=18 and K2=1,031). In this way, the first variable frequency divider 4 is configured as a pulse swallow counter, and its division factor is switched according to only two variables. This helps reduce transmission delay and thereby achieve a higher operation rate.

In this way, a first feedback signal FP1 obtained by dividing the output signal VO of the voltage-controlled oscillator VCO by a division factor of N is fed to the other input terminal of the first phase comparator PC1.

The first phase comparator PC1 performs phase comparison between the first reference signal FR1 and the first feedback signal FP1, and feeds phase comparison signals U1 and D1 to the first charge pump CP1. That is, the first phase comparator PC1 performs phase comparison between one first reference signal FR1 and one first feedback signal FP1 output from the first variable frequency divider 4.

Based on those phase comparison signals, the first charge pump CP1 produces a first output voltage ER1, and feeds it to the low-pass filter LPF.

The low-pass filter LPF, by eliminating high-frequency components contained in the first output voltage ER1, produces a control voltage CV, and feeds it to the voltage-controlled oscillator VCO. Thus, the reference signal generator 2, first phase comparator PC1, first charge pump CP1, low-pass filter LPF, voltage-controlled oscillator VCO, first variable frequency divider 4, and other components together constitute a first PLL frequency synthesizer 7.

The second variable frequency divider 8 is fed with a previously determined division factor M Assuming that the total number of reference signals FR1 to FR16 is n, the second variable frequency divider 8 is fed with (set to perform frequency division by), for example, a division factor M related to n. Here, the second reference signal FR is the OR of (n−1) reference signals FR2 to FR16.

For example, when n=16, the second variable frequency divider 8 is fed with a division factor M that is sometimes equal to the integer part of N/n and other times equal to the integer part of N/n plus one. In the example being described, where N=66,002, N/n=66,002/16=4,125+2/16.

Thus, the value of N/n consists of an integer part (for example 4,125) and a remainder part (for example, 2/16). The second variable frequency divider 8 performs frequency division by a division factor that is sometimes equal to the integer part of N/n, namely 4,125, and other times equal to the integer part of N/n plus one (namely, 4,126). If N is an integral multiple of n, the second variable frequency divider 8 performs frequency division by a division factor equal to the integer part of N/n.

The following descriptions deal with a case where M=4, 125. Based on the above division factor 4,125, the scattering circuit 30 (described later) calculates the number of times K3 that the swallow counter should operate and the number of times K4 that the course counter should operate in the second variable frequency divider 8, and sets the calculated numbers K3 and K4 in those counters, respectively (for example, K3=39 and K4=128).

In this way, the second variable frequency divider 8 divides the output signal VO of the voltage-controlled oscillator VCO by a division factor of M, and outputs a second feedback signal FP consisting of 16 high signals (feedback signals; see the projecting portions marked FP in FIG. 8) fp1 and FP2 to FP16 per period TR.

Thus, the second phase comparator PC2 receives, at one input terminal thereof, the second reference signal FR, which is the OR of the (n−1) reference signals FR2 to FR16 produced by the reference signal generator 2 and having different phases, and, at the other input terminal thereof, the second feedback signal FP output from the second variable frequency divider 8.

The second phase comparator PC2 performs phase comparison between the second feedback signal FP output from the second variable frequency divider 8 and the second reference signal FR, and outputs phase comparison signals U2 and D2.

Thus, the first and second variable frequency dividers 4 and 8 together constitute a variable frequency divider 12. The first and second phase comparators PC1 and PC2 together constitute a phase comparator 13.

As described above, there are provided a plurality of variable frequency dividers 4 and 8 that divide the output signal VO of the voltage-controlled oscillator VCO to output feedback signals FP1 and FP. The phase comparator 13 performs phase comparison between the feedback signals FP1 and FP and the reference signals FR1 and FR, respectively.

Based on the phase comparison signals U2 and D2 output from the second phase comparator PC2, the second charge pump CP2 feeds a second output voltage ER2 to the low-pass filter LPF.

The low-pass filter LPF, by eliminating high-frequency components contained in the second output voltage ER2, produces a control voltage CV, and feeds it to the voltage-controlled oscillator VCO. Thus, the reference signal generator 2, second phase comparator PC2, second charge pump CP2, low-pass filter LPF, voltage-controlled oscillator VCO, second variable frequency divider 8, and other components together constitute a second PLL frequency synthesizer 10c.

The scattering circuit 30 is composed of, for example, an N/n calculator 32, an N/n integer part circuit 33, an N/n integer part plus one circuit 34, a selector 35, a counter 36, a calculator 37, and other components.

The N/n calculator 32 receives from the controller 31 the division factor N and the value n (where N is an integer obtained by dividing the preset frequency by the reference frequency, and n is the total number of reference signals FR1 to FR16). The N/n calculator 32 divides the division factor N by the total number n. In the example being described, N=66,002 and n=16. Thus, the N/n calculator 32 calculates in this way: N/n=66,002/16=4,125+2/16.

The N/n integer part circuit 33 temporarily stores the integer part of N/n calculated by the N/n calculator 32, namely the value 4,125. The N/n integer part plus one circuit 34 temporarily stores the value obtained by adding one to the integer part of N/n calculated by the N/n calculator 32, namely the value 4,126.

According to a control signal B (consisting of, for example, high and low signals) from the calculator 37, the selector 35 selects and outputs either of the output of the N/n integer part circuit 33 and the output of the N/n integer part plus one circuit 34 to the second variable frequency divider 8.

The counter 36 receives, at one input terminal thereof, the first feedback signal FP1 so that, every time the first feedback signal FP1 turns high, the count value is reset (set to be "1").

The counter 36 receives, at the other input terminal thereof, the second feedback signal FP so that, every time the second feedback signal FP turns high (fp1, FP2, . . . , and FP16), the number C of occurrences of the high level is counted. The counter 36 outputs the remainder part (A/16, where A=2 in the example being described) of the value N/n to the calculator 37.

Based on the remainder part A/16 fed from the N/n calculator 32 and the number C fed from the counter 17, the calculator 37 performs calculations to judge whether (A/16)×C≧1 or not. If the calculator 37 judges (by calculation) that (A/16)×C≧1, it feeds a high signal to the selector 35 to make it select the output of the N/n integer part plus one circuit 34.

By contrast, if the calculator 37 judges that (A/16)×C<1, it feeds a low signal to the selector 35 to make it select the output of the N/n integer part circuit 33.

In this way, the scattering circuit 30, on one hand, performs calculations to find the integer part of N/n with the help of the N/n calculator 32 and the N/n integer part circuit 33 and, on the other hand, performs calculations to find the integer part of N/n plus one with the help of the N/n calculator 32 and the N/n integer part plus one circuit 34.

Through those calculations, the scattering circuit 30 feeds a division factor M that is sometimes equal to the integer part of N/n and other times equal to the integer part of N/n plus one to the second variable frequency divider 8 through the selector 35.

Incidentally, instead of the N/n calculator 32, N/n integer part circuit 33, N/n integer part plus one circuit 34, and selector 35, it is also possible to provide a storage portion 38. The storage portion 38 is realized with, for example, a memory.

The storage portion 38 is fed with the division factor N and the total number n from the controller 31. Moreover, the storage portion 38 is fed with the number C from the counter 36. The storage portion 38 is so configured as to feed a division factor M to the second variable frequency divider 8.

As described above, the scattering circuit 30 stores the integer part of N/n and the integer part of N/n plus one. Alternatively, the scattering circuit 30 may feed, after reading the aforementioned data from the storage portion 38, a division factor that is sometimes equal to the integer part of N/n and other times equal to the integer part of N/n plus one to the second variable frequency divider 8.

When a select signal S is fed to the selector 35 (for example, when the select signal S is high), as described above, according to the judgment made by the calculator 37, the selector 35 selects between the integer part of N/n and the integer part of N/n plus one. This sets the second variable frequency divider 8 to perform frequency division at a division factor M that is some times equal to the integer part of N/n and other times equal to the integer part of N/n plus one. That is, here, the selection between the integer part of N/n and the integer part of N/n plus one is performed (i.e., the second variable frequency divider 8 is fed with a division factor M that is some times equal to the integer part of N/n and other times equal to the integer part of N/n plus one) in such a way that the scattering circuit 30 corrects for the error ascribable to the remainder part.

By contrast, when no select signal S is fed to the selector 35 (for example, when the select signal S is low), the selector 35 ignores the control signal B form the calculator 37, and always selects the output of the N/n integer part circuit 33.

As a result, the second variable frequency divider 8 receives through the selector 35 a division factor M that is constantly equal to the integer part of N/n. In this way, the selector 35 serves to choose whether to make the scattering circuit 30 correct for the error ascribable to the remainder part or not.

Next, with reference to FIGS. 7 and 8, the operation of this PLL circuit 1 will be described. First, suppose, for example, that the user sets the preset frequency at 1,650,050 kHz with the frequency setting keys (not shown) and then presses a start key.

The controller 31 feeds the first variable frequency divider 4 with a division factor N=1,650,050 kHz/25 kHz=66,002. Simultaneously, the controller 31, through the scattering circuit 30, feeds the second variable frequency divider 8 with a division factor M.

The fixed frequency divider M divides the oscillation signal (25.6 MHz) from the reference oscillator OSC to 400 kHz, and the reference signal generator 2 outputs a plurality of reference signals FR1 to FR16 having different phases. The reference signals FR1 to FR16 have a reference frequency of 25 kHz, and rise at time points t1 to t16, respectively (see FIG. 8).

The first variable frequency divider 4 divides the output signal VO of the voltage-controlled oscillator VCO by a division factor of N=66,002 to produce a feedback signal FP1, and feeds the feedback signal FP1 (see the projecting portion marked FP1 in FIG. 8) to the first phase comparator PC1.

The first phase comparator PC1 performs phase comparison between the first reference signal FR1 and the first feedback signal FP1, and feeds phase comparison signals U1 and D1 to the first charge pump CP1.

Based on the phase comparison signals U1 and D1, the first charge pump CP1 feeds a first output voltage ER1 to the low-pass filter LPF. Based on the first output voltage ER1, the low-pass filter LPF feeds a control voltage CV to the voltage-controlled oscillator VCO.

The controller 31, at the same time that it feeds the first variable frequency divider 4 with the division factor N, feeds the N/n calculator 32 of the scattering circuit 30 with the division factor N and the total number n.

The N/n calculator 32 calculates N/n=66,002/16=4,125+2/16. Based on the result of this calculation, the N/n integer part circuit 33 temporarily stores the integer part of N/n, namely 4,125, and the N/n integer part plus one circuit 34 temporarily stores the integer part of N/n plus one, namely 4,126.

The calculator 37 receives from the N/n calculator 32 the remainder part (A/16=2/16). When the first feedback signal FP1 turns high, the counter 36, to which it is fed, is reset and feeds the calculator 37 with a number C=1 as the number of times that the second feedback signal FP has turned high (simultaneously, the second variable frequency divider 8 outputs a feedback signal Fp1).

As a result, the calculator 37 judges that (A/16)×C=(2/16)× 1<1, and accordingly the calculator 37 feeds the selector 35 with a control signal B (a low signal). According to this control signal B, the selector 35 selects the output of the N/n integer part circuit 33, and sets the second variable frequency divider 8 to perform frequency division by a division factor of M=the integer part of N/n=4,125.

Thus, the high signal fp1 in the second feedback signal FP is a signal resulting from frequency division by a division factor equal to the integer part of N/n=4,125. Thereafter, when the second variable frequency divider 8 outputs the high signal FP2 as the second feedback signal FP, the counter 36 outputs a number C=2 as the number of times that the second feedback signal FP has turned high.

As a result, the calculator 37 judges that (A/16)×C=4/16<1, the calculator 37 outputs a low signal, and the selector 35 selects the output of the N/n integer part circuit 33. This sets the second variable frequency divider 8 to perform frequency division by a division factor equal to the integer part of N/n (4,125). Thus, the high signal FP2 is a signal resulting from frequency division by a division factor equal to the integer part of N/n.

Likewise, the high signals FP3, FP4, FP5, FP6, and FP7 in the second feedback signal FP are signals resulting from frequency division by a division factor equal to the integer part of N/n (4,125).

Thereafter, when the second variable frequency divider 8 outputs the high signal FP8 as the second feedback signal FP, the counter 36 outputs a number C=8 as the number of times that the second feedback signal FP has turned high.

As a result, the calculator 37 judges that (A/16)×C=(2/16)× 8=1≧1, the calculator 37 outputs a high signal, and the selector 35 selects the output of the N/n integer part plus one circuit 34. This sets the second variable frequency divider 8 to perform frequency division by a division factor equal to the integer part of N/n plus one (4,126). Thus, the high signal FP8 is a signal resulting from frequency division by a division factor equal to the integer part of N/n plus one (4,126).

Immediately thereafter, the counter 36 resets the number C (to zero). Thereafter, when the second variable frequency divider 8 outputs the high signal FP9 as the second feedback signal FP, the counter 36 outputs a number C=1. Thus, the high signal FP9 is a signal resulting from frequency division by a division factor equal to the integer part of N/n (4,125).

Likewise, the high signals FP10, FP11, FP12, FP13, FP14, and FP15 in the second feedback signal FP are signals resulting from frequency division by a division factor equal to the integer part of N/n (4,125).

Thereafter, when the second variable frequency divider 8 outputs the high signal FP16 as the second feedback signal FP, the counter 36 outputs a number C=8 as the number of times that the second feedback signal FP has turned high.

As a result, the calculator 37 judges that (A/16)×C=(2/16)× 8=1≧1, the calculator 37 outputs a high signal, and the selector 35 selects the output of the N/n integer part plus one circuit 34. This sets the second variable frequency divider 8 to perform frequency division by a division factor equal to the integer part of N/n plus one (4,126). Thus, the high signal FP16 is a signal resulting from frequency division by a division factor equal to the integer part of N/n plus one (4,126).

The following is a summary of the operations described above. The controller 31 feeds the N/n calculator 32 with the division factor N and the number n. For example, when N=66,002 and n=16, the N/n calculator 32 calculates N/n= 66,002/16=4,125+2/16. Here, 4,125 is the integer part of N/n, and and 2/16 is the remainder part thereof.

In the configuration described above, during one period TR of the first reference signal FR1, the second variable frequency divider 8 outputs n high signals (fp1 and FP2 to FP16). As described above, the counter 36 counts the number C of occurrences of high signals and feeds the count to the calculator 37. The calculator 37, if it judges that the remainder part x the number C=(2/16)×C is equal to or greater than 1, makes the selector 35 feed the second variable frequency divider 8 with a division factor equal to the integer part of N/n plus one.

After this division factor has been output, the counter 36 resets the number C to zero. Then, the calculator 37, if it judges that the remainder part x the number C=(2/16)×C is smaller than 1, makes the selector 35 feed the second variable frequency divider 8 with a division factor equal to the integer part of N/n.

As a result, for two high signals FP8 and FP16 in the second feedback signal FP, the second variable frequency divider 8 is set to perform frequency division by a division factor M equal to the integer part of N/n plus one (4,126). On the other hand, for 14 high signals (fp1, FP2 to FP7, and FP9 to FP15) in the second feedback signal FP, the second variable frequency divider 8 is set to perform frequency division by a division factor M equal to the integer part of N/n (4,125).

Likewise, in a case where N/n=an integer part+A/16 (where A is an integer in the range from 0 to 15), for A high signals in the second feedback signal FP, the second variable frequency divider 8 is set to perform frequency division by a division factor M equal to the integer part of N/n plus one. On the other hand, for (16−A) high signals in the second feedback signal FP, the second variable frequency divider 8 is set to perform frequency division by a division factor M equal to the integer part of N/n.

In a case where N/n=an integer part (K)+(A/16), the average division factor P of the high signals obtained by the means described above is calculated in the following manner. Among the high signals mentioned above, A high signals result from frequency division by a division factor of K+1, and (16−A) high signals result from frequency division by a division factor of K. Hence, P is given by $$P = (1/16) \times [(K+1) \times A + K \times (16-A)] \quad (1)$$
$$= (1/16) \times (KA + A + 16K - KA)$$
$$= (1/16) \times (16K + A)$$
$$= K + (A/16)$$

Thus, the scattering control achieved by the scattering circuit 30 permits the second variable frequency divider 8 to perform frequency division accurately by any division factor of N/n (where N and n are integers fulfilling N>n) during one period TR of the first reference signal FR1.

In other words, the provision of the scattering circuit 30, which corrects for the error ascribable to the remainder part (A/16) of N/n, makes it possible to set the second variable frequency divider 8 to perform frequency division by a division factor corrected for the error ascribable to the remainder part (A/16) of N/n.

As described above, the second variable frequency divider 8 outputs a second feedback signal (consisting of high signals fp1 and FP2 to FP16) resulting from frequency division by a division factor equal to the integer part of N/n or equal to the integer part of N n plus one.

The second phase comparator PC2 performs phase comparison between the rising edge FR2 of the second reference signal FR and the high signal FP2 in the second feedback signal FP, and outputs phase comparison signals U2 and D2. Likewise, the second phase comparator PC2 performs phase comparison between the rising edge FRA (where A is an integer in the range from 3 to 16) of the second reference signal FR and the high signal FPA (where A is an integer in the range from 3 to 16) in the second feedback signal FP, and outputs phase comparison signals U2 and D2.

Here, as described above, the second variable frequency divider 8 is set to perform frequency division by a division factor corrected for the remainder part A/16 of N/n by the scattering circuit 30 (i.e., a division factor that is sometimes equal to the integer part of N/n and other times equal to the integer part of N/n plus one). This permits the second variable frequency divider 8 to perform frequency division accurately by any division factor of N/n.

Thus, the second phase comparator PC2 outputs accurate phase comparison signals U2 and D2 containing no error.

Based on the phase comparison signals U2 and D2 fed thereto, the second charge pump CP2 feeds a second output voltage ER2 to the low-pass filter LPF. Based on the second output voltage ER2, the low-pass filter LPF feeds a control voltage CV to the voltage-controlled oscillator VCO.

In this configuration, phase comparison is performed 16 times during one period TR of the first reference signal FR1 (see FIG. 8). Thus, the lock-up time (the time required for the output signal VO to substantially reach the preset frequency) is reduced to about 1/16 of that experienced in a conventional configuration with a single phase comparator. In this way, the first and second PLL frequency synthesizers 7 and 10c repeat the phase comparison operations described above.

As the first PLL frequency synthesizer 7 repeats the sequence of phase comparison operations described above, the frequency of the output signal VO comes within ±300 Hz of the preset frequency. This state is called the steady state.

In the steady state also, the second PLL frequency synthesizer 10c does not feed error signals to the voltage-controlled oscillator VCO.

When the steady state is established in this way, the lock detector 11 (not shown) connected to the first phase comparator PC1 feeds a high signal (a synch detect signal) to the controller 31. In response to the synch detect signal, the controller 31 stops the operation of the second variable frequency divider 8, stops the operation of the second phase comparator PC2, and stops the operation of the second charge pump CP2.

On the other hand, in response to the synch detect signal, the controller 31 keeps the first variable frequency divider 4 operating and keeps the first PLL frequency synthesizer 7 operating, but stops the operation of the second PLL frequency synthesizer 10c.

As described above, when the PLL circuit 1c is in the searching state and in the steady state, no error signals are fed to the voltage-controlled oscillator VCO.

Accordingly, the first feedback signal FP1, which results from exact frequency division by the first variable frequency divider 4 by a division factor of N in the first PLL frequency synthesizer 7, contains no error. Thus, the first phase comparator PC1 performs phase comparison between the exact first feedback signal FP1 containing no error and the first reference signal FR1.

Accordingly, the first phase comparator PC1 feeds exact phase comparison signals U1 and D1 containing no error to the first charge pump CP1. As a result, an exact control voltage CV containing no error is fed through the low-pass filter LPF to the voltage-controlled oscillator VCO.

In this way, in the steady state, the voltage-controlled oscillator VCO can stably output the output signal VO having exactly the preset frequency 1,650,050 kHz.

INDUSTRIAL APPLICABILITY

According to the present invention, in a PLL circuit, a plurality of phase comparison signals are output. This makes it possible to perform phase comparison a plurality of times during one period of the reference signal, and thus helps reduce the lock-up time. Moreover, when the output signal comes into synchronism, the operation of all variable frequency dividers but one is stopped. This helps reduce the electric power consumption of the PLL circuit. The first variable frequency divider is fed with a division factor of N. This permits the first variable frequency divider to perform exact frequency division. Whether the output signal is in synchronism or not is checked based on a feedback signal from the first variable frequency divider and the reference signal. This ensures a correct checking operation (checking result).

Moreover, the second variable frequency divider is fed with a division factor of N/n. This permits the second variable frequency divider to output a plurality of feedback signals during one period of the reference signal. As a result, the second phase comparator performs phase comparison a plurality of times during one period of the reference signal. This helps reduce the lock-up time. Furthermore, only two variable frequency dividers are needed to perform phase comparison a plurality of times (for example, 16 times) during one period of the reference signal. This helps reduce the number of variable frequency dividers needed. This makes the PLL circuit inexpensive and easy to fabricate in the form of an LSI.

Moreover, by making one variable frequency divider perform exact frequency division (for example, by a division factor of N), it is possible, in the steady state, to output an output signal of which the frequency is exactly equal to the preset frequency. Moreover, by making the other variable frequency divider perform frequency division by a division factor of, for example, N/n, it is possible, in the searching state, to perform phase comparison a plurality of times during one period of the reference signal. This helps reduce the lock-up time.

Moreover, while the first feedback signal is being output, the second feedback signal is prevented from being output. This prevents interference between the phase comparison output of the first phase comparator, to which the first feedback signal is fed, and the phase comparison output of the second phase comparator, to which the second feedback signal is fed. This helps prevent unlocking (the phenomenon in which the output signal VO that is coming into phase suddenly deviates from the preset frequency).

Moreover, the first phase comparator performs phase comparison between the first reference signal, one of a plurality of reference signals, and the first feedback signal, of which there is one. This ensures exact phase comparison. As a result, it is possible, in the steady state, to output an output signal of which the frequency is exactly equal to the preset frequency. The second phase comparator performs phase comparison between the second reference signal and the third feedback signal (from which the output of the first feedback signal has been eliminated). This prevents interference between the output of the first phase comparator and the output of the second phase comparator, and thus helps prevent unlocking. Furthermore, the means for eliminating the output of the second feedback signal while the first feedback signal is being output is realized as a logic circuit. This helps simplify the circuit configuration.

Moreover, a plurality of variable frequency dividers are provided, and the second PLL frequency synthesizer including one variable frequency divider is so configured as not to use error signals to control the voltage-controlled oscillator. As a result, by making the first PLL frequency synthesizer including another variable frequency divider perform frequency division exactly by a division factor, it is possible to output an output signal of which the frequency is exactly equal to the preset frequency. In the searching state, using error signals does not cause any problem in practice, because the output signal has not yet reached the preset frequency. In the almost steady state and in the steady state, no error signals are used. This makes it possible to output an output signal of which the frequency is exactly equal to the preset frequency.

When a signal produced by the generator is located in a nonresponsive period G, an error signal output from the phase comparator is made low by that signal. As a result, the error signal is not passed to the succeeding stage (the charge pump and the components following it). Moreover, when the division factor N/n contains an integer part and a remainder part, the second variable frequency divider performs frequency division by a division factor equal to the integer part. This eliminates the need to use a variable frequency divider that performs fractional frequency division. This helps reduce costs and achieve stable operation.

The signal that determines the nonresponsive periods is produced based on the reference signal fed to the phase comparator. As a result, the positional relationship (i.e., the relative timing) between the feedback signal output from the variable frequency divider and the nonresponsive periods is controlled accurately. Moreover, the nonresponsive periods are so produced as to extend equally to the left and right sides of each rising or trailing edge of the reference signal. Thus, by turning the signal low when the phase difference between the reference signal and the feedback signal becomes smaller than a predetermined value, it is possible to output an error signal with accurate timing.

Moreover, a scattering circuit is provided to correct for the error ascribable to the remainder part of N/n. Thus, the variable frequency divider can perform frequency division by a desired division factor of N/n. Furthermore, the provision of the scattering circuit permits the variable frequency divider to perform frequency division by a division factor equal to an integer. This eliminates the need to use a variable frequency divider that performs fractional frequency division, which is expensive and operates unstably.

Moreover, the first variable frequency divider performs frequency division by a division factor of N (where N is an integer), and thus can output an exact feedback signal (i.e., having no error from the ideally divided feedback signal). Moreover, the second variable frequency divider is set to perform frequency division by a division factor corrected for the error ascribable to the remainder part of N/n by the scattering circuit, and thus can perform frequency division by a desired division factor of N/n. As a result, the second variable frequency divider can output an exact feedback signal having no error from the ideally divided feedback signal.

Moreover, the division factor by which the second variable frequency divider is set to perform frequency division is given as a combination of the integer part of N/n and the integer part of N/n plus one. As a result, a frequency divider that performs integral frequency division can be used as the second variable frequency divider. Furthermore, it is possible to perform frequency division exactly by a desired division factor of N/n (see formula (1)).

Moreover, by feeding the values N and n to the storage portion, the scattering circuit outputs the values of the integer part of N/n and the integer part of N/n plus one. This eliminates the need to calculate N/n, and thus helps make the scattering circuit simple, inexpensive, less space-consuming, and easy to fabricate in the form of an LSI. Furthermore, the combination ratio of the two values is also stored in the storage portion and is output therefrom. This makes it possible to output the aforementioned combination automatically, and thus helps make the scattering circuit simply and inexpensive.

Moreover, for example, when the division factor N is great, the remainder part of N/n is small relative to the integer part of N/n. Thus, even if no correction for the error ascribable to the remainder part by the scattering circuit is selected in the searching state, performing frequency division by a division factor equal to the integer part of N/n results in a comparatively small error signal. By contrast, when the division factor N is small, the remainder part of N/n is great relative to the integer part of N/n. Accordingly, correction for the error ascribable to the remainder part by the scattering circuit is selected so that frequency division is performed exactly by a division factor of N/n so as not to output an error signal. In this way, whether to perform correction or not can be determined according to how great the division factor N (i.e., the preset frequency) is. This helps widen the choice of specifications.

What is claimed is:

1. A PLL circuit comprising:
   a reference signal generator that produces a plurality of reference signals;
   a first variable frequency divider that divides an output signal of a voltage-controlled oscillator by a division factor of N equal to a value obtained by dividing a preset frequency by a reference frequency of the reference signals to output a feedback signal corresponding to one of the reference signals;
   a second variable frequency divider that divides the output signal of the voltage-controlled oscillator by a division factor of N/n (where n is an integer equal to or greater than 3) to produce a plurality of feedback signals corresponding to the rest of the reference signals; and
   a phase comparator that performs phase comparison between the feedback signals and the reference signals respectively,
   wherein, when the output signal of the voltage-controlled oscillator is exactly or almost in synchronism with the preset signal, error signals produced by the phase comparator are not passed to the voltage-controlled oscillator.

2. A PLL circuit as claimed in claim 1, further comprising:
   a generator that produces a signal that determines nonresponsive periods during which the error signals are not passed,
   wherein the signal that determines the nonresponsive periods prevents the phase comparator connected to the second variable frequency divider from passing error signals appearing in the nonresponsive periods to a succeeding stage.

3. A PLL circuit as claimed in claim 2,
wherein the division factor N/n consists of an integer part and a remainder part, the second variable frequency divider performs frequency division by a division factor equal to the integer part of N/n, and the phase comparator does not pass the error signals containing an error ascribable to the remainder part to the succeeding stage.

4. A PLL circuit as claimed in claim 2,
wherein the signal that determines the nonresponsive periods is produced according to the reference signals fed to the phase comparator.

5. A PLL circuit as claimed in claim 2,
wherein the generator produces the signal that determines the nonresponsive periods in such a way that each nonresponsive period extends for equal lengths from before and to after each rising or trailing edge of the reference signals, and AND operation is performed between a phase comparison signal of the phase comparator and the signal that determines the nonresponsive periods.

6. A PLL circuit as claimed in claim 1,
wherein the reference signal generator produces a plurality of reference signals having different phases,
wherein one of the reference signals is a first reference signal, and
wherein the PLL circuit further comprises a first phase comparator that performs phase comparison between a first feedback signal output from the first variable frequency divider and the first reference signal.

7. A PLL circuit as claimed in claim 6,
wherein an OR of (n−1) reference signals other than the first reference signal among the n reference signals is a second reference signal; and
wherein the PLL circuit further comprises a second phase comparator that performs phase comparison between a second feedback signal output from the second variable frequency divider and the second reference signal.

8. A PLL circuit as claimed in claim 6, further comprising:
a generator that produces a signal that determines nonresponsive periods during which the error signals are not passed,
wherein the signal that determines the nonresponsive periods determines the nonresponsive periods in such a way that the nonresponsive periods are not located in periods synchronous with rising or trailing edges of the first reference signal.

9. A PLL circuit comprising:
a reference signal generator that produces a plurality of reference signals;
a plurality of variable frequency dividers that individually divide an output signal of a voltage-controlled oscillator to produce feedback signals, the variable frequency dividers including at least:
  a first variable frequency divider that is set to perform frequency division by a division factor of N (where N is an integer) equal to a value obtained by dividing a preset frequency by a reference frequency of the reference signals; and
  a second variable frequency divider that is set to perform frequency division by a division factor of N/n (where n is an integer fulfilling N>n);
a phase comparator that performs phase comparison between the feedback signals and the reference signals respectively; and
a rounding circuit that feeds the second variable frequency divider with a division factor corrected for an error ascribable to a remainder part of N/n by rounding the division factor N/n containing the remainder part to a combination of a plurality of different integral division factors.

10. A PLL circuit as claimed in claim 9,
wherein the rounding circuit calculates a integer part of N/n and the integer part of N/n plus one.

11. A PLL circuit as claimed in claim 10,
wherein the rounding circuit, after the calculation, feeds the second variable frequency divider with a division factor selected from a division factor equal to the integer part of N/n and a division factor equal to the integer part of N/n plus one.

12. A PLL circuit as claimed in claim 9,
wherein the rounding circuit includes a storage portion that stores values of the integer part of N/n and the integer part of N/n plus one.

13. A PLL circuit as claimed in claim 12,
wherein the rounding circuit, after reading out the values stored in the storage portion, feeds the second variable frequency divider with a division factor selected from a division factor equal to the integer part of N/n and a division factor equal to the integer part of N/n plus one.

14. A PLL circuit as claimed in claim 9,
wherein the rounding circuit includes a selector that chooses whether to correct for the error ascribable to the remainder part or not.

15. A PLL circuit as claimed in claim 9,
wherein the reference signal generator produces a plurality of reference signals having different phases,
wherein one of the reference signals is a first reference signal, and
wherein the PLL circuit further comprises a first phase comparator that performs phase comparison between a first feedback signal output from the first variable frequency divider and the first reference signal.

16. A PLL circuit as claimed in claim 15,
wherein there are n (where n is a positive integer equal to or greater than 2) of the reference signals:
wherein an OR of (n−1) reference signals other than the first reference signal is a second reference signal; and
wherein the PLL circuit further comprises a second phase comparator that performs phase comparison between a second feedback signal output from the second variable frequency divider and the second reference signal.

17. A PLL circuit as claimed in claim 16,
wherein, assuming that N/n=K+A/n (where K and A are integers fulfilling $0 \leq A<n$), and therefore that the integer part equals K and the remainder part equals A/n, the rounding circuit
  includes a counter that is reset and starts counting in response to the first reference signal and that is reset and restarts counting from 1 when a count C thereof (where C is an integer equal to or greater than 1) and the remainder part A/n fulfill a relationship $C \times A/n \geq 1$,
  feeds the second variable frequency divider with a division factor K when the count C of the counter fulfills a relationship $C \times A/n < 1$, and
  feeds the second variable frequency divider with a division factor K+1 when the count C of the counter fulfills a relationship $C \times A/n \geq 1$.

* * * * *